United States Patent [19]

Shichijo et al.

[11] 4,225,971
[45] Sep. 30, 1980

[54] TUNING APPARATUS FOR PROVIDING TUNING INDICATION

[75] Inventors: Hajime Shichijo, Fugisawa; Yutaka Miyasaka, Tokyo, both of Japan

[73] Assignee: Sony Corporation, Tokyo, Japan

[21] Appl. No.: 974,229

[22] Filed: Dec. 29, 1978

[30] Foreign Application Priority Data

Dec. 29, 1977 [JP] Japan ............................... 52-158865
Jan. 31, 1978 [JP] Japan ................................. 53-9782

[51] Int. Cl.² ........................... H04B 1/06; H03J 5/10
[52] U.S. Cl. .................................... 455/155; 455/157; 455/176; 455/183; 116/242; 74/10R; 334/86
[58] Field of Search ............... 325/455, 458, 459, 464, 325/468; 334/7, 8, 86, 87, 15; 116/241–243, 281, 282, DIG. 29, DIG. 31; 74/10 R, 10.1, 10.41

[56] References Cited

U.S. PATENT DOCUMENTS

| | | | |
|---|---|---|---|
| 3,756,191 | 9/1973 | Olah | 325/455 X |
| 3,953,800 | 4/1976 | Nakamura et al. | 325/455 |
| 3,962,641 | 6/1976 | Suwa | 325/455 |

*Primary Examiner*—Robert L. Griffin
*Assistant Examiner*—Jin F. Ng
*Attorney, Agent, or Firm*—Lewis H. Eslinger; Alvin Sinderbrand

[57] ABSTRACT

Tuning apparatus which is tunable to different broadcast frequencies and including a scale provided with indicia corresponding to such broadcast frequencies and a pointer movable across the scale to indicate the particular broadcast frequency to which the tuning apparatus is tuned. The pointer is supported by a movable support which is guided by a guide shaft. A plurality of markers are slidably guided along at least one guide rail and are individually settable to desired locations adjacent the scale, thereby representing particular broadcast frequencies to which the tuning apparatus is tunable. A key also is slidable along the guide shaft with the movable support, the key being selectively operative to engage a desired one of the markers to move the engaged marker therewith as the support is moved, whereby the marker is set to a desired position by reason of its engagement with the key. Tuning circuitry having a controllable oscillator for generating an oscillating signal whose frequency is variable and determinative of the broadcast frequency to which the tuning apparatus is tuned is enabled to produce an output representing received information when the movable support is moved to an aligned position with a respective one of the markers. Thus, the tuning apparatus can be rapidly tuned to any preset broadcast frequency as represented by the particular marker with which the pointer is aligned.

19 Claims, 45 Drawing Figures

FIG. 9
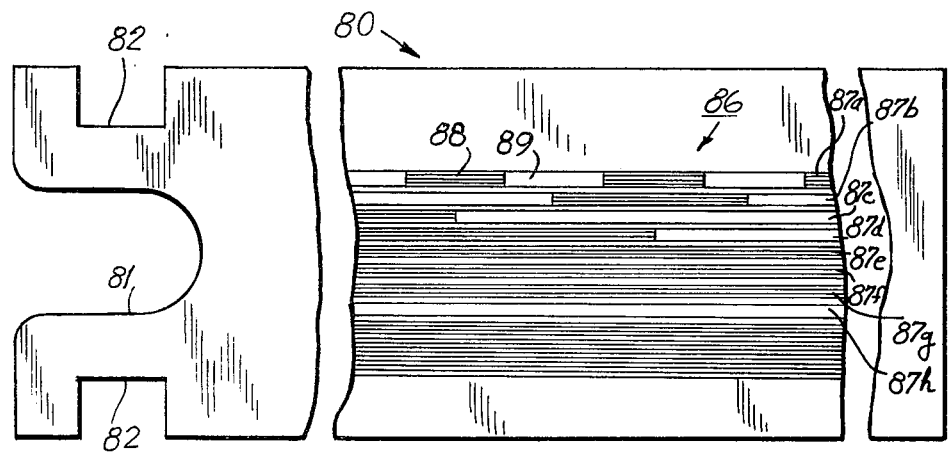
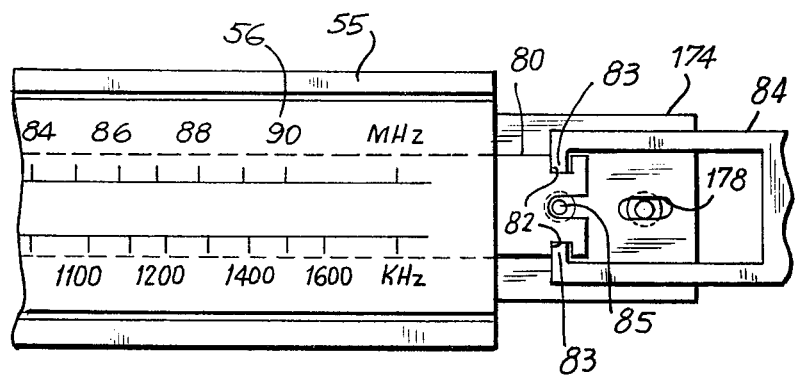
FIG. 10

FIG. 23
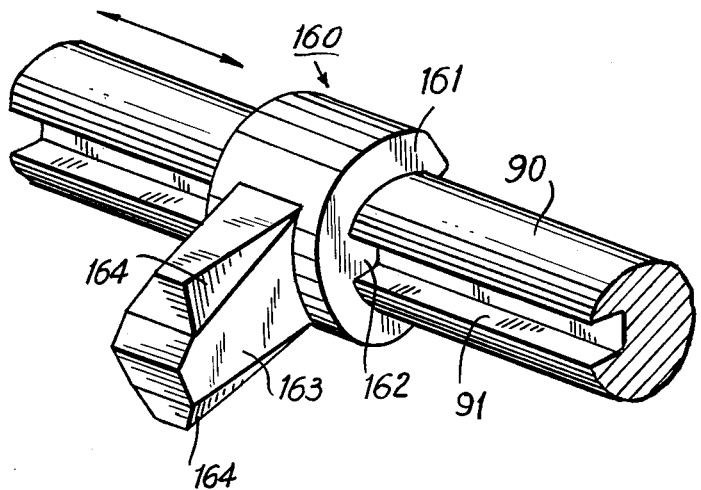
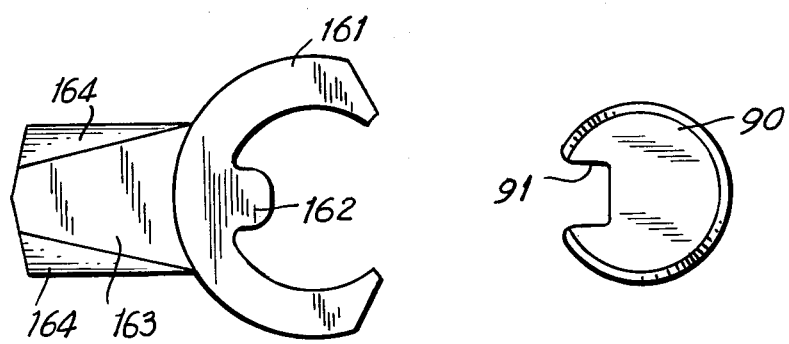
FIG. 24
FIG. 25
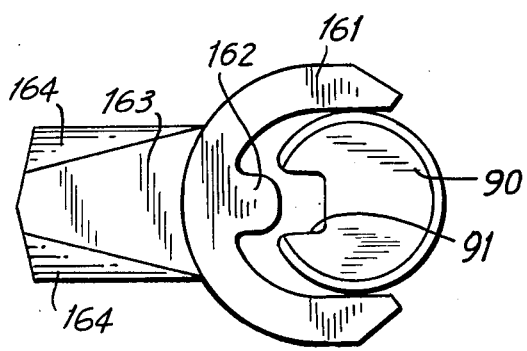
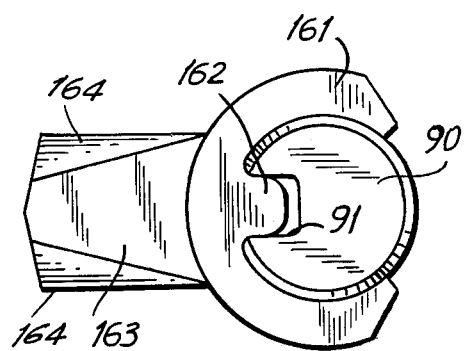
FIG. 26

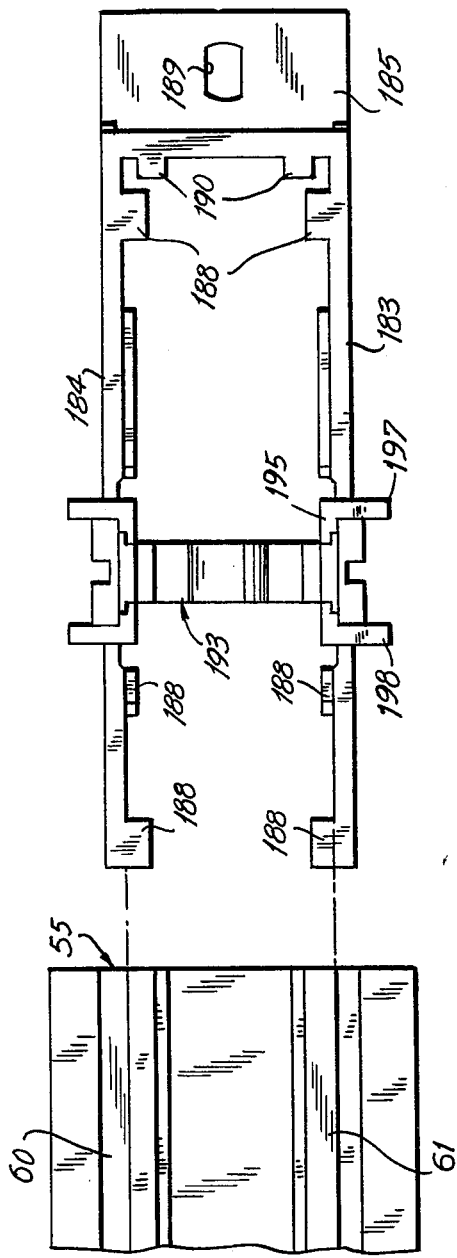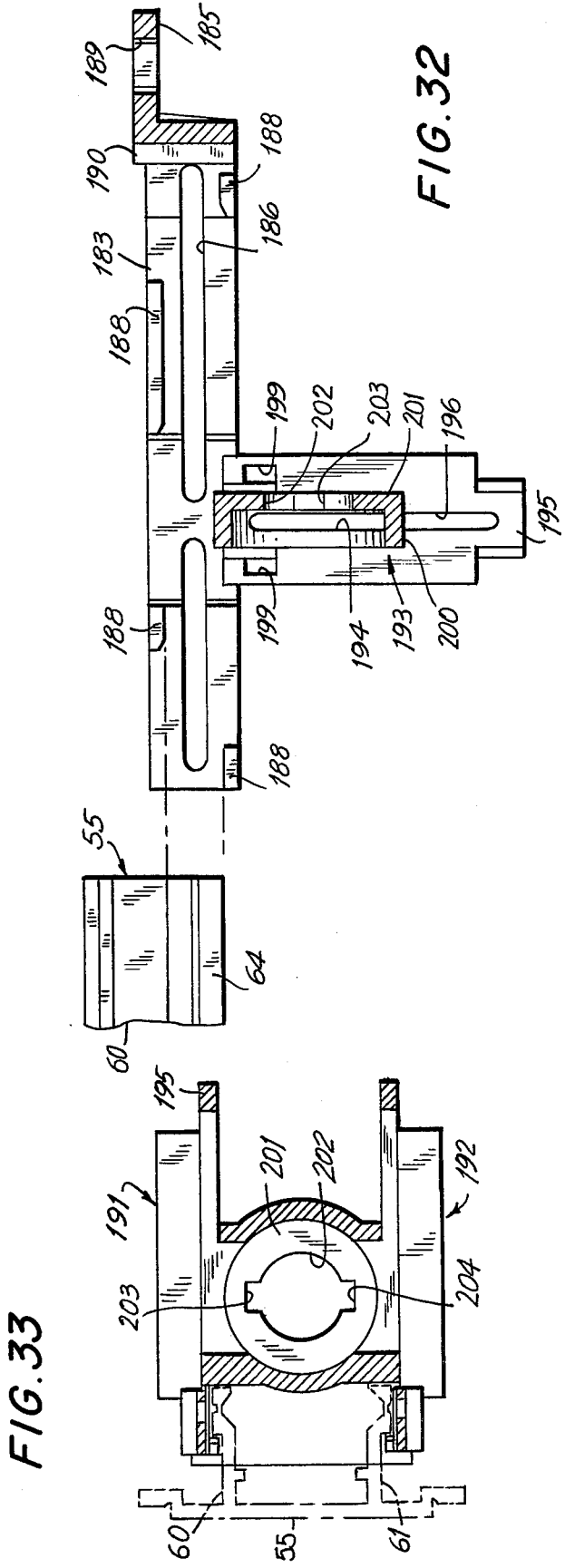
FIG. 31
FIG. 32
FIG. 33

TUNING APPARATUS FOR PROVIDING TUNING INDICATION

BACKGROUND OF THE INVENTION

This invention relates to tuning apparatus and, more particularly, to tuning apparatus which is tunable to desired ones of broadcast frequencies, such as FM and AM broadcast frequencies.

In many geographic locations, and particularly, larger metropolitan areas, a large number of FM and AM radio stations are provided. Thus, a user who has a home entertainment tuning device may receive a multitude of FM and AM broadcast frequencies. Often, the user may prefer to listen to the program entertainment which is transmitted over a relatively small number of such available broadcast frequencies. If a particular program received over one of these broadcast frequencies is not satisfactory, the user may adjust his tuning device so as to receive the program which is transmitted over another preferred broadcast frequency. However, many receivable broadcast frequencies may exist in the frequency band between the two stations to which the user tunes his tuning device. As the tuning condition of this device is changed, the programs which are transmitted via those intermediary broadcast frequencies will be received. Since the tuning condition of the tuning device is changed abruptly during this station-changing operation, the brief reception of undesired broadcast frequency information may be quite annoying and distracting to the user.

In order to rapidly change the tuning condition of a radio receiver from one station to another without accompanying undesired program information which is present in those broadcast frequencies which lie between the two stations, push-button radio tuning apparatus has been proposed. Such push-button tuning devices are used advantageously in automotive radio receivers. However, such push-button tuning devices generally are not provided in high fidelity home entertainment tuning apparatus.

Recently, frequency synthesizer tuning devices have been proposed. One such frequency synthesizer tuning device is disclosed in U.S. Pat. No. 3,962,641, assigned to the assignee of the present invention. In this frequency synthesizer tuning device, the usual adjustable air capacitor, which heretofore had been used for tuning a device to a desired frequency, is replaced by a phase-locked loop having a voltage controlled oscillator whose frequency is determined by a programmable frequency divider which, in turn, has a frequency dividing ratio which is established by a digital signal representing a particular radio station. When a desired radio station is selected, the digital signal corresponding to that station establishes a corresponding frequency dividing ratio. The frequency of the oscillating signal produced by the voltage controlled oscillator is divided by the established, or programmed, dividing ratio, and the frequency-divided frequency is compared to a reference frequency. Any difference therebetween is used to adjust the frequency of the voltage controlled oscillator such that the frequency-divided version thereof is equal to the reference frequency. In this manner, the frequency of the voltage controlled oscillator, before frequency division, establishes the tuning condition of the tuning device which is necessary to receive the desired station information. It is desirable to provide, in a frequency synthesizer tuning device, presettable means whereby the tuning apparatus can be rapidly and accurately tuned to preset FM and/or AM radio stations. It also is desirable to provide, in such tuning apparatus, the ability to change the preset FM and/or AM stations in accordance with the particular preferences of the user.

OBJECTS OF THE INVENTION

Therefore, it is an object of the present invention to provide improved tuning apparatus.

Another object of this invention is to provide improved tuning apparatus of the frequency synthesizer type.

A further object of this invention is to provide tuning apparatus wherein certain FM and/or AM stations can be preset, as desired, and the tuning apparatus can be tuned rapidly to any one of these preset stations.

An additional object of this invention is to provide improved tuning apparatus of the aforedescribed type wherein the preset FM and/or AM stations can be changed easily in accordance with the particular preferences of the user.

Yet another object of this invention is to provide improved tuning apparatus of the aforedescribed type which is advantageously used in home entertainment radio receiving systems.

Various other objects, advantages and features of the present invention will become readily apparent from the ensuing detailed description, and the novel features will be particularly pointed out in the appended claims.

SUMMARY OF THE INVENTION

In accordance with this invention, tuning apparatus is provided which can be tunable to different broadcast frequencies. The tuning apparatus includes a scale having indicia thereon corresponding to the broadcast frequencies, and a pointer movable across the scale to indicate the particular broadcast frequency to which the tuning apparatus is tuned. A movable support assembly supports the pointer and is slidably driven along a guide shaft. A plurality of markers are slidably supported on at least one guide rail, each marker being individually settable to a desired position adjacent the scale so as to represent a particular broadcast frequency to which the tuning apparatus is tunable. A key also is slidable along the guide shaft with the support assembly, the key being selectively operative to engage a desired one of the markers and move the engaged marker therewith as the support assembly is driven, whereby the marker is set to a desired position by reason of its engagement with the key. Tuning circuitry having a controllable oscillator for generating an oscillating signal whose frequency is variable and determinative of the broadcast frequency to which the tuning apparatus is tuned is enabled to produce a signal output when the support assembly is driven into an aligned relationship with a respective one of the markers. Thus, when the pointer is in alignment with a preset marker, the signal information contained in the broadcast frequency identified by that marker is received.

BRIEF DESCRIPTION OF THE DRAWINGS

The following detailed description, given by way of example, will best be understood in conjunction with the accompanying drawings in which:

FIG. 9 is a plan view of one embodiment of a code plate which forms a portion of the frequency synthesizer which is used with the present invention;

FIG. 10 represents the manner in which the code plate is assembled in alignment with the tuning scale of the tuning apparatus;

FIGS. 20 and 21 represent the manner in which the light switch is assembled to the support assembly;

FIG. 22 is a rear view of another embodiment of the light switch which can be used with this invention;

FIGS. 23-26 represent the key and the manner in which the key is mounted on the guide shaft in the tuning apparatus of the present invention;

FIGS. 31-33 are top, sectional side and sectional front views of the support structure shown in FIG. 30;

DETAILED DESCRIPTION OF A PREFERRED EMBODIMENT

Figure 1:
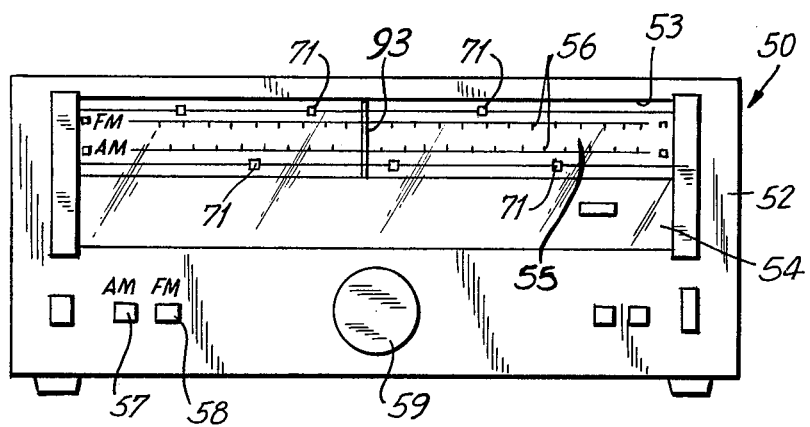
FIG. 1 is a front view of one embodiment of tuning apparatus which is provided with the present invention.
Figure 2:
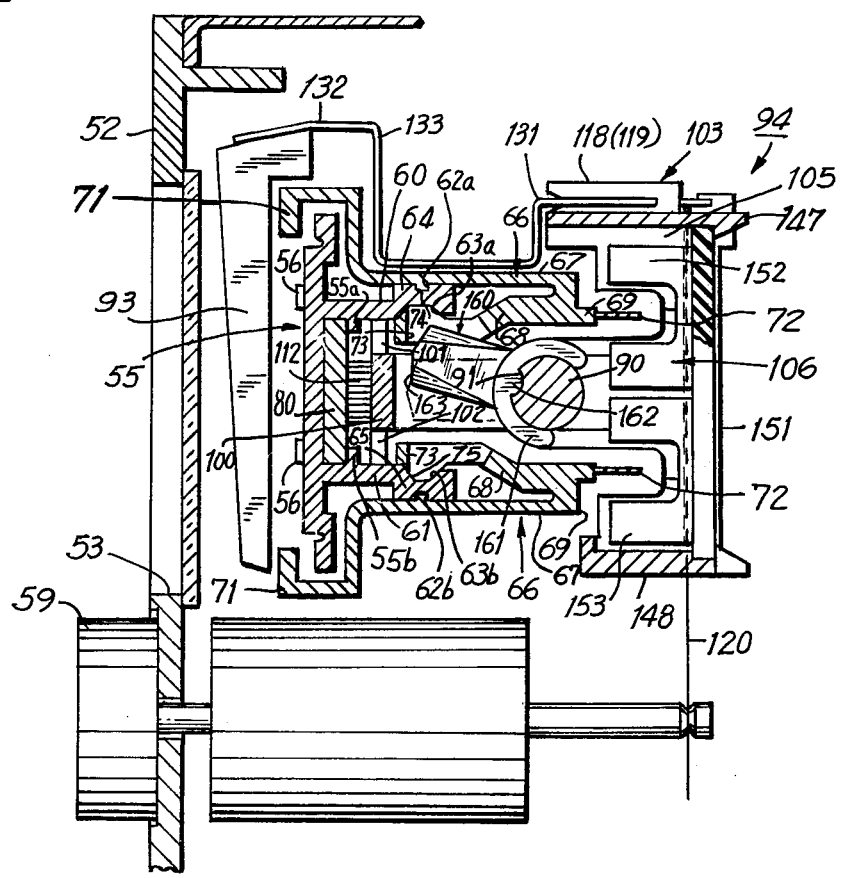
FIG. 2 is a partial sectional view of the mechanical arrangement of the tuning apparatus of this invention.
Figure 3:
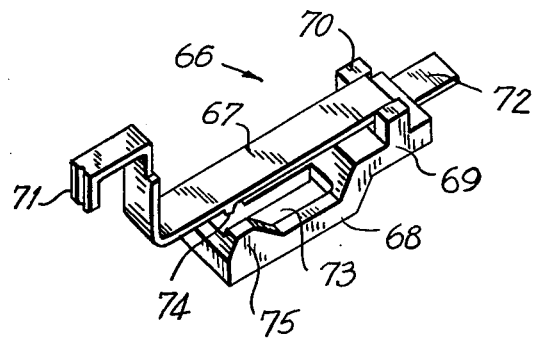
FIG. 3 is a perspective view of a settable marker which can be used with this invention.
Figure 4:
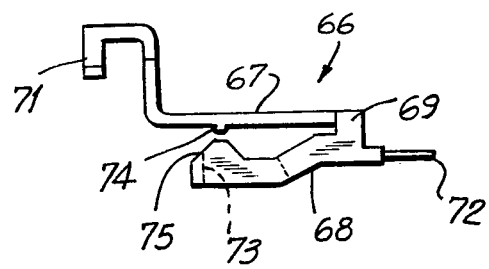
FIGS. 4 and 5 are side and bottom views, respectively, of the marker.
Figure 5:
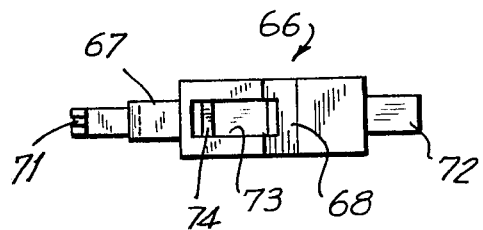

Referring now to the drawings, wherein like reference numerals are used throughout, and in particular to FIG. 1, there is illustrated a front view of tuning apparatus 50 which incorporates the various features disclosed herein. For the purpose of the present discussion, it will be assumed that tuning apparatus 50 is adapted to be tuned to broadcast frequencies included in the FM band as well as to broadcast frequencies included in the AM band. However, if desired, the teachings of the present invention can be incorporated in tuning apparatus which is tunable to broadcast frequencies which are included only in the FM band or only in the AM band. Tuning apparatus 50 is provided with a front panel 52 in which are disposed various switches and indicators which commonly are used to control the tuning and receiving conditions of, for example, high fidelity tuning devices. Front panel 52 is provided with a window 53 for receiving a transparent plate 54. Disposed behind this transparent plate, and as shown more particularly in FIG. 2, is a scale plate 55 bearing indicia 56 which represent the particular broadcast frequencies, or stations, to which the tuning apparatus is tunable. Operating switches 57 and 58 are provided in front panel 52, these operating switches being operable by a user of tuning apparatus 50 to preset either an AM broadcast frequency or an FM broadcast frequency to which the tuning apparatus is to be tuned. An FM/AM selector switch is provided for the selection of a desired frequency band. The signal information contained in the selected broadcast frequency to which tuning apparatus 50 is tuned will be recovered. The tuning apparatus also is provided with a tuning knob 59 which is coupled to a shaft journaled for rotation in front panel 52 and operable to control the tuning condition of tuning apparatus 50. As tuning knob 59 is rotated, a pointer 93 is driven across scale plate 55 so as to represent the particular station, as identified by indicia 56, to which the tuning apparatus is tuned.

In accordance with one feature of the present invention, a plurality of indicators 71 are provided, these indicators being disposed in two sets, one set being associated with the FM frequency band and the other set being associated with the AM frequency band. As will be described in greater detail below, indicators 71 are slidable relative to scale plate 55 and can be set to any desired position therealong. When an indicator 71 is juxtaposed a particular indicium 56, thus representing the corresponding station to which tuning apparatus 50 can be tuned, the user may rapidly tune the tuning apparatus to that station merely by rotating tuning knob 59 until pointer 93 is aligned with that indicator 71. The position of indicator 71 along scale plate 55 can be adjusted, as desired by the user, so as to change the particular preset station to which the tuning apparatus can be tuned.

Figure 6:
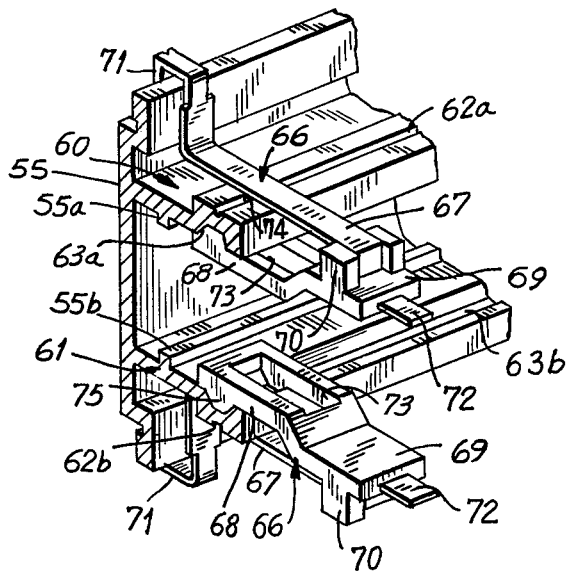
FIG. 6 is a perspective view of the manner in which the markers are guidably supported on guide rails.
Figure 7:
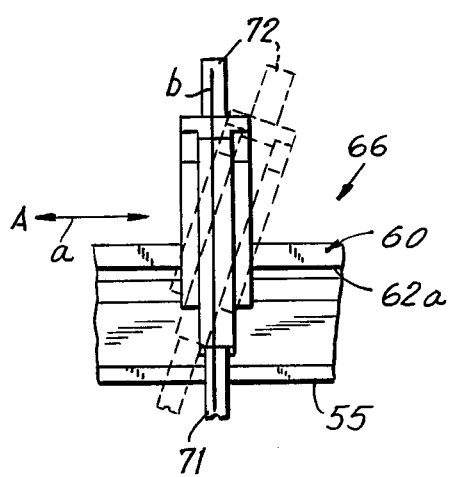
FIGS. 7 and 8 represent the stability of the markers which are used with the present invention.
Figure 8:
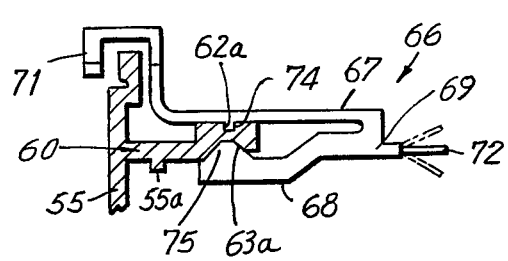
Figure 11:
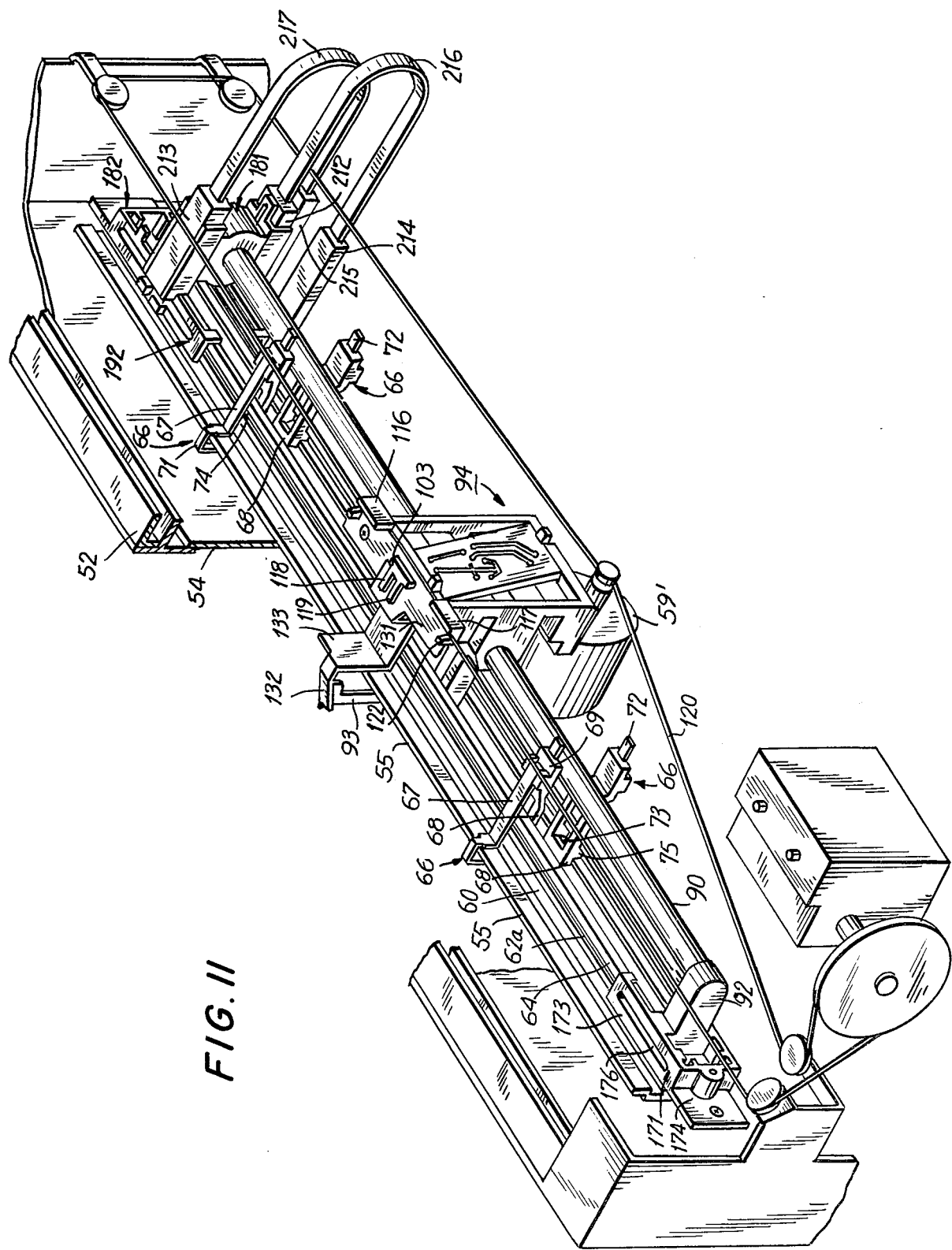
FIG. 11 is a perspective view of various sub-assemblies of the tuning apparatus in accordance with the present invention.

FIGS. 2, 6 and 11 illustrate, in greater detail, the sub-assembly which includes indicator 71 and the manner in which the respective indicators are supported and moved relative to scale plate 55. In particular, scale plate 55 is provided with an upper guide rail 60 and a lower guide rail 61, both guide rails extending in a longitudinal direction and being disposed in respective planes which are perpendicular to scale plate 55. The guide rails project from the rear surface of the scale plate, as best shown in FIG. 2. For the purpose of the present discussion, it is assumed that the "front" direction is toward front panel 52 and the "rear" direction is opposite thereto. Thus, indicia 56 are disposed on the front surface of scale plate 55, while upper and lower guide rails 60 and 61 both project from the rear surface of the scale plate. Upper guide rail 60 is provided with a longitudinal U-shaped groove 62a provided on the upper surface of rail extension 64, and with a longitudinal V-shaped groove 63a provided on the lower surface of rail extension 64. Lower guide rail 61 also is provided with a rail extension, designated as rail extension 65, and this rail extension is provided with a U-shaped groove 62b on the lower surface thereof and a V-shaped groove 63b on the upper surface thereof. Thus, upper and lower guide rails 60 and 61 are seen to be mirror images of each other, and the respective grooves provided on rail extensions 64 and 65 likewise are mirror image versions, or inverted versions, of each other.

The respective rail extensions are furnished with the U-shaped and V-shaped grooves to provide a suitable support for markers 66 to which indicators 71 are attached. As shown in FIGS. 2–8, each marker is provided with an upper leg 67 and a lower leg 68 which are joined at a juncture 69. Legs 67 and 68 are formed of a resilient material, such as a synthetic resin, and are biased naturally toward each other. Since these legs are resilient, they may be spread apart to be mounted upon rail extensions 64 and 65. A bridge 70 is supported on lower leg 68 to establish a pivot axis for upper leg 67. A rib 74 is provided on the lower surface of leg 67 approximately mid-way of the length thereof. This rib fits into U-shaped groove 62a (or 62b) and is slidable therein. Lower leg 68 is provided with a rib 75 in the vicinity of the free end thereof. As is seen from FIGS. 2, 3, 4, 6 and 8, rib 75 is substantially V-shaped and is adapted to fit into V-shaped groove 63a (or 63b) of rail extension 64 (or 65). When rib 74 is inserted into U-shaped groove 62a and when rib 75 is inserted into V-shaped groove 63a, marker 66 is slidable along the length of upper guide rail 60, and particularly, along the length of rail extension 64. In a similar manner, a marker 66 is mounted upon rail extension 65 of lower guide rail 61 so as to be slidable along the length of the guide rail.

Indicator 71 is seen to be a substantially U-shaped member which extends from the free end of leg 67. With reference to an upper marker 66, indicator 71 is an inverted U-shaped member. As best seen in FIG. 2, this U-shape of indicator 71 is bent around the upper edge of scale plate 55 so that the free end of the indicator is visible through window 53. As marker 66 slides along guide rail 60, the relative position of the marker is perceived by the juxtaposition of indicator 71 with respect to indicia 56, as best shown in FIG. 2. Similarly, the U-shape of indicator 71 provided on a lower marker 66 is not inverted; and as shown in FIG. 2, this U-shape is bent about the lower edge of scale plate 55. As the lower marker slides along guide rail 61, the position thereof is ascertained by perceiving the juxtaposition of indicator 71 relative to indicia 56.

In each marker 66, leg 68 is provided with an aperture 73, as best seen in FIGS. 2, 3, 5 and 6. Thus, in an upper marker 66, aperture 73 faces toward lower guide rail 61; and, conversely, in a lower marker 66, aperture 73 faces toward upper guide rail 60. Each aperture is adapted to receive a key 160, selectively insertable therein, so that marker 66 is slidably driven along upper guide rail 60 or along lower guide rail 61 as the key is driven. This is described in greater detail hereinbelow. It will be appreciated that this slidable driving movement of marker 66 establishes the marker at a desired position along the guide rail, and thus at a desired position along scale plate 55 relative to indicia 56.

Each marker 66 is provided with a projection 72, used as a light shutter plate, to be described, extending rearwardly from juncture 69, as shown in FIGS. 2–8. The purpose of projection 72 is to intercept, or block, light in a light switch when the light switch is moved to an aligned position with the respective marker 66. It will be explained that the light switch is housed in a sub-assembly which also is used to support pointer 93, whereupon projection 72 interrupts, or opens the light switch when pointer 93 is aligned with indicator 71 of the respective marker.

The manner in which a marker 66 is secured to a rail extension of either the upper or lower guide rail is readily apparent. That is, legs 67 and 68 are displaced from each other so that ribs 74 and 75 can be aligned with respect to the U-shaped and V-shaped grooves. Because of the resilience of the material with which marker 66 is constructed, when legs 67 and 68 no longer are forced apart, they are restored toward each other such that the ribs fit within the respective grooves in the rail extension. Preferably, leg 68 is wider than leg 67 such that the marker is supported with high stability. Rib 75 may, in fact, be formed of a pair of ribs disposed on opposite sides of aperture 73, as best seen in FIG. 6. Furthermore, because of the resilience of the material from which marker 66 is constructed, and since ribs 74 and 75 are of complementary shapes with respect to U-shaped and V-shaped grooves 62a and 63a, respectively, once the marker is fitted onto a guide rail, it is held in a stabilized position so as to resist misalignment thereof which may be caused by vibration. Hence, even if marker 66 is twisted, as represented by the broken lines in FIG. 7, or deflected, as represented by the broken lines in FIG. 8, it will return to its proper, normal position. In this position, the marker extends in a longitudinal direction normal to the rear surface of scale plate 55. It will be explained below that, in this normal position, projection 72 will be in proper alignment with the light switch when pointer 93 is aligned with indicator 71.

It is appreciated that ribs 74, 75 and grooves 62, 63 constitute mounting elements which are complementary to each other. That is, the ribs provided on marker 66 are complementary to the grooves provided on rail extensions 64 (65). If desired, the rail extension may be provided with ribs and the marker may be provided with complementary grooves. As a further alternative, the marker may be provided with one rib and one groove and the rail extension may be provided, complementarily, with one groove and one rib, respectively. As yet a still further alternative, the marker may be provided with a single rib and the rail extension may be provided with a single groove. This, however, would require that the marker be constructed of material which is of a higher resiliency. Thus, it may be seen that the purpose of these mounting elements on the marker and on the rail extension is to maintain the marker in a normal, stabilized position, and to enable the marker to be slid along the rail extension to a desired location only when the marker is positively driven. Because of the resiliency of the material with which the marker is constructed, the marker grips the rail extension so that it will not be displaced relative to indicia 56 on scale plate 55 due to vibration, shock and the like. The preset positions of the respective markers thus are maintained.

Referring now to FIGS. 2, 9 and 10, the tuning apparatus is provided with a code plate 80 which is insertable between the rear surface of scale plate 55 and ribs 55a and 55b, the latter extending in a direction toward each other from upper and lower guide rails 60 and 61, respectively. As best shown in FIGS. 9 and 10, code plate 80 is provided with a cut-out portion 81 at one end thereof. Along the longitudinal edges of the code plate in the vicinity of cut-out portion 81 are notches 82. These notches receive engaging hooks 83 of a suitable tool 84 (FIG. 10) so as to be slidably inserted or withdrawn from its compartment provided behind scale plate 55. Once the code plate is positioned properly behind the scale plate, it is fixedly secured by a set screw 85.

As shown in FIG. 9, code plate 80 is provided with a code pattern thereon. This code pattern is comprised of coded indicia 86 which are arranged to form discrete, multi-bit digital signals. As an example, the coded indicia may be in binary or inverted binary format. In the illustrated embodiment, the coded indicia are disposed in parallel strips 87a, 87b, . . . 87h, each parallel strip being formed of patterns of conductive and non-conductive segments 88 and 89, respectively. For example, there may be provided eight parallel strips with the uppermost strip having alternating conductive and non-conductive segments, each segment constituting the least significant bit in the multi-bit digital signal. The next strip also is provided with alternating conductive and non-conductive segments, each segment constituting the next least significant bit of the multi-bit digital signal. This array of conductive and non-conductive segments in the remaining parallel strips is used to represent the progressively more significant bits in the multi-bit digital signal, with strip 87h representing the most significant bit. As will be described, a wiper element is provided with a number of brushes, each brush being in alignment with a respective strip 87a . . . 87h. If the brushes are arranged so as to be aligned in a direction normal to the longitudinal direction of the parallel strips, then the contact of each brush with a particular conductive or non-conductive segment in its associated strip will result in a corresponding bit of the multi-bit digital signal. For example, if a brush is in contact with a conductive strip, it may produce a binary "1"; while if the brush is in contact with a non-conductive strip, it will produce a binary "0". Hence, as the wiper element moves along strips 87a . . . 87h in the longitudinal direction, that is, as the wiper element scans these strips, the multi-bit digital signal produced thereby changes in value as the position of the wiper element changes.

Each conductive segment included in coded indicia 86 may be supplied with a relatively higher voltage level, corresponding to a binary "1", and each non-conductive segment may be provided with a relatively lower voltage level, corresponding to a binary "0". This may be achieved by making that portion of code plate 80 over which strips 87a . . . 87h are positioned of conductive material and by supplying a relatively higher voltage to that material. If the conductive segments are in contact with the conductive portion of plate 80, they too will be supplied with a relatively higher voltage, whereas the non-conductive segments will be at a much lower voltage. As may be appreciated by one of ordinary skill in the art, other alternatives may be used to supply the respective conductive and non-conductive segments in the respective parallel strips with appropriate voltages.

Although coded indicia 86 provided on code plate 80 has been described herein as being formed of conductive and non-conductive segments arranged in parallel strips, other indicia can be used, if desired. For example, and as disclosed in aforementioned U.S. Pat. No. 3,962,641, the coded indicia may be optical indicia, such as an array of holes behind which is provided a light source. A moving photosensor then may be used to scan the array of holes and sense the presence or absence of such holes by sensing the light which passes therethrough.

The manner in which the sensed multi-bit digital signal represented by the particular array of conductive and non-conductive segments, as detected by the wiper element, is used to tune the tuning apparatus will be described in greater detail hereinbelow. Suffice it to say that each respective multi-bit digital signal identifies a particular broadcast frequency. As the tuning condition of the tuning apparatus is changed, as by operating tuning knob 59, a different multi-bit digital signal is produced, thus representing a different broadcast frequency, or station.

The manner in which pointer 93 is assembled and driven, and the sub-assembly for the aforementioned wiper element and key now will be described with reference to FIGS. 2 and 12. A guide shaft 90 is provided rearwardly of scale plate 55, this guide shaft extending lengthwise, as shown more clearly in FIG. 11, between a socket 92, disposed at one end thereof for supporting the guide shaft, and a rotatable support 181, provided at the other end thereof for supporting and driving the guide shaft.

A support assembly 94 is slidably mounted on guide shaft 90, the support assembly serving to support pointer 93 and the wiper element, the latter being identified as wiper element 112. Support assembly 94 is comprised of a base 95 which, in side view, appears as an E-shaped structure, as shown in FIGS. 20 and 21. A bifurcated bracket 96, which appears as the middle leg of the E-shape, is formed of a left leg 96a and a right leg 96b, as viewed in FIG. 12. Each leg is provided with a respective channel 97a and 97b, respectively, through which guide shaft 90 passes. It can be seen from FIG. 18 that each leg 97a, 97b includes a top web and a bottom web, the top and bottom webs of a leg being connected by a side wall and by a front wall. Right and left legs 98 and 99, respectively (as viewed in FIG. 12), are secured to the front walls which join the top and bottom webs of legs 96b and 96a, respectively. Legs 98 and 99 are of similar construction, and as can be seen from FIG. 12, leg 98 is comprised of top and bottom struts 98a and 98b, respectively. Legs 98 and 99 extend in the forward direction from base 95 and are joined by a cross-piece 100.

Figure 12:
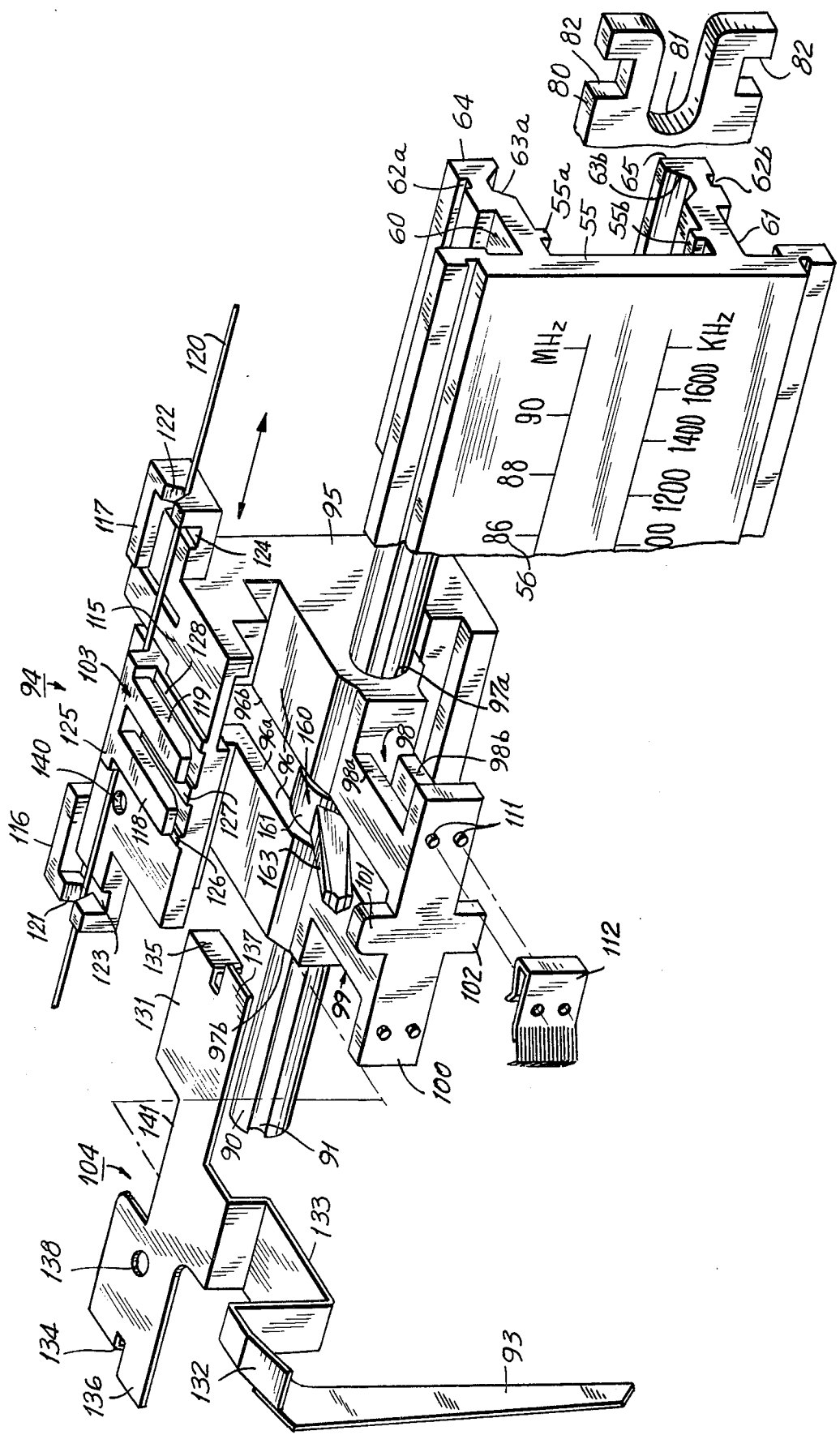
FIG. 12 is a perspective view of the pointer, key and support assembly used in the tuning apparatus of this invention.

Projections 101 and 102 extend upwardly and downwardly, respectively, from cross-piece 100, as shown in FIG. 12. These projections function as stabilizing members and are adapted to ride along upper and lower guide rails 60 and 61, respectively, as shown in FIG. 2. In particular, projections 101 and 102 are positioned between ribs 55a, 55b and rail extensions 64, 65, as shown. On the front surface of cross-piece 100, that is, the surface of the cross-piece which faces code plate 80 (FIG. 2), are provided bosses 111 to which wiper element 112 is attached. The cooperation between cross-piece 100, wiper element 112 and code plate 80 is shown in FIG. 2. Hence, as support assembly 94 is slidably driven along guide shaft 90, wiper element 112 scans the parallel strips 87a, . . . 87h of code plate 80 so as to produce a multi-bit digital signal corresponding to the array of conductive and non-conductive segments which are sensed by the individual brushes of the wiper element. As may be appreciated, the particular digital signal which is produced by the wiper element is related to the position of support assembly 94, and thereby identifies the particular station which is indicated by pointer 93.

Figure 18:
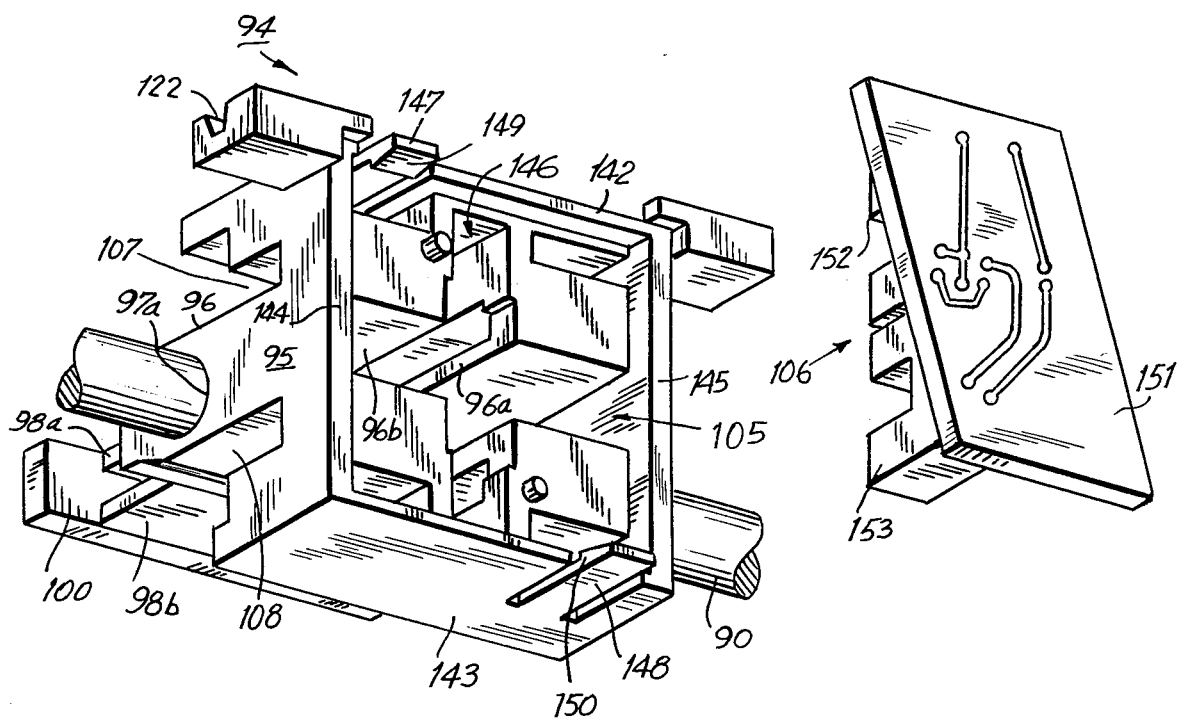
FIG. 18 is a perspective, exploded view of the support assembly.

Pointer 93 is included in a pointer assembly 104, this assembly being secured to support assembly 94 by a pointer mounting clip 103. In addition to having the pointer assembly mounted thereon, base 95 forms a housing 105 for a light switch 106. Housing 105 is provided with a central opening 146 which extends from the top to the bottom of this housing, as shown in FIG. 18, and also separates legs 96a and 96b of bifurcated bracket 96, as shown in FIG. 12. Gaps 107 and 108 are provided between the middle leg and the top and bottom legs, respectively, of the E-shaped housing. As shown in FIG. 2, projection 72 of markers 66 are adapted to be received in gaps 107 and 108 as support assembly 94 is slidably driven along guide shaft 90.

Base 95 has an upper portion 115 which serves as a table upon which pointer mounting clip 103 is supported. An L-shaped ridge 116 is provided on the rear and left side edge of upper portion 115, and a similar L-shaped ridge 117 is provided on the rear and right side edge of upper portion 115, as viewed in FIGS. 12 and 13. Pointer mounting clip 103 includes arms 118 and 119 which are joined at one end of each by a cross-piece 125. Thus, arms 118 and 119 extend forwardly of cross-piece 125, and the free ends of these arms are chamfered. Arms 118 and 119 cooperate with ribs 126, 127 and 128, provided on upper portion 115 of base 95 so as to define a slot therebetween. As can be seen from the front view of support assembly 94, ribs 126–128 and arms 118 and 119 are offset, or staggered, with respect to each other. The slot defined by arms 118, 119 and ribs 126–128 is adapted to receive a plate 131 to which pointer 93 is secured.

Figure 13:
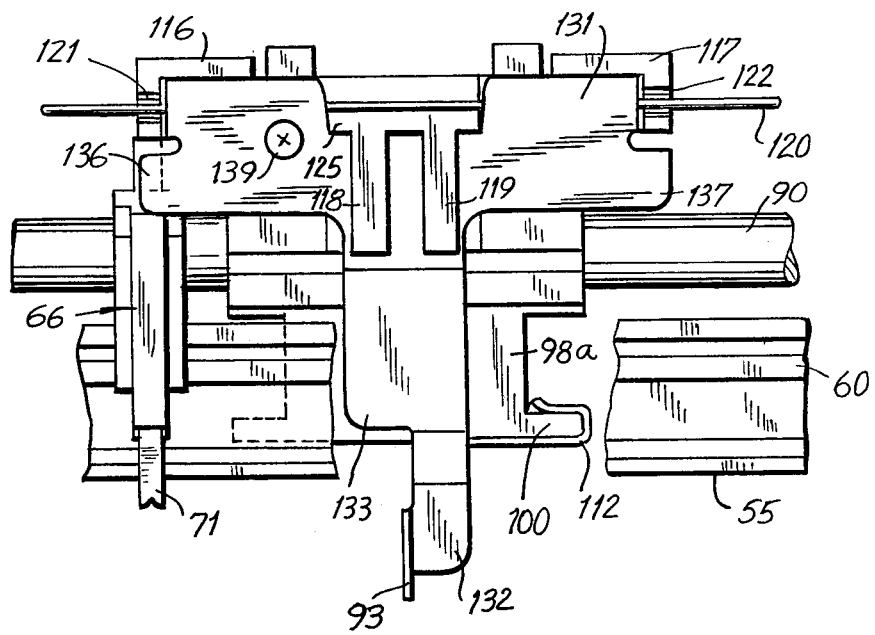
FIGS. 13 and 14 are top and front views of a portion of the apparatus shown in FIG. 12.

As best seen from FIG. 11, a cable 120 is provided to drive support assembly 94 as a function of the rotation of tuning knob 59. The tuning knob is coupled to cable 59 by suitable means, and this cable extends about various guide pulleys and also is secured to support assembly 94. As shown in FIGS. 12 and 13, L-shaped ridges 116 and 117 are provided with notches 121 and 122, these notches being illustrated as substantially V-shaped. Notches 121 and 122 receive cable 120 which extends across upper portion 115 behind cross-piece 125 of pointer mounting clip 103. In addition, upper portion 115 is provided with grooves 123 and 124 which are adjacent ridges 116 and 117, respectively, these grooves extending in a direction that is substantially perpendicular to cable 120. It is seen that upper portion 115 of base 95 is provided with a pair of wings on which the L-shaped ridges, notches and grooves are provided.

Pointer assembly 104 is comprised of plate 131 having a forwardly extending portion 132 which is coupled to the plate by a gooseneck extension 133. Pointer 93 is secured to forwardly extending portion 132. At the left and right sides (as viewed in FIGS. 12–14) of plate 131 are provided depending ears 134 and 135. These ears are adapted to be inserted into grooves 123 and 124, respectively, so as to secure cable 120 therein. The left and right sides of plate 131 also are provided with extensions 136 and 137 which, as will be described below, facilitate the assembly and disassembly of pointer assembly 104 on support assembly 94. Plate 131 also is provided with an aperture 138 which is aligned with hole 140 in upper portion 115 of base 95 so that a screw 139 secures plate 131 upon this upper portion. Plate 131 also includes a cut-out 141 for accommodating pointer mounting clip 103 when the plate is mounted upon upper portion 115, as shown in FIG. 13.

Figure 15:
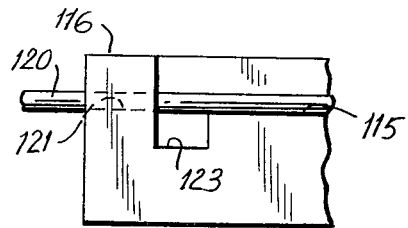
FIGS. 15-17 represent the manner in which the pointer assembly is secured to the support assembly thereof.
Figure 16:
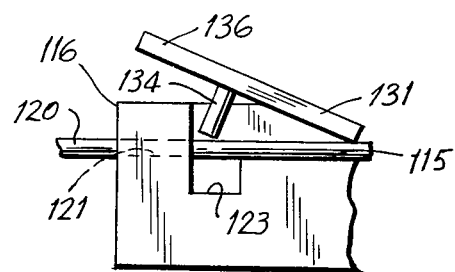
Figure 17:
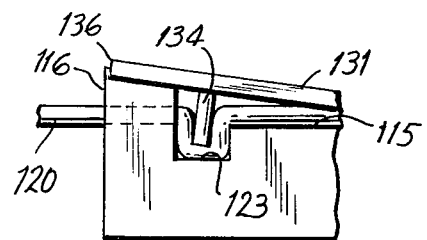

In assembling pointer assembly 104 to base 95, plate 131 is inserted into the slot defined by legs 118 and 119 of pointer mounting clip 103 and ribs 126–128. The plate then is pushed in the rearward direction so that cut-out 141 is positioned within the pointer mounting clip. Extensions 136 and 137 are raised, for example, an operator lifts these extensions, so that ears 134 and 135 are disposed over grooves 123 and 124, respectively, as plate 131 is continued to be pushed in the rearward direction. When plate 131 abuts against ridges 116 and 117, extensions 136 and 137 are lowered so that ears 134 and 135 are inserted into grooves 123 and 124. As shown in FIG. 15, before plate 131 reaches its final position on upper portion 115 of base 95, cable 120 extends from notch 121 to notch 122, and thus passes over grooves 123 and 124. With extensions 136 and 137 raised, as shown in FIG. 16, ears 134 and 135 can be positioned over grooves 123 and 124 with cable 120 interposed between each ear and its respective groove. Then, and as shown in FIG. 17, when extensions 136 and 137 are lowered, ears 134 and 135 force cable 120 deeply into grooves 123 and 124 so as to secure the cable to base 95. In this regard, it may be desirable that cable 120 can be compressed when ears 134 and 135 are inserted into grooves 123 and 124. In this manner, cable 120 is clamped to support assembly 94 such that when this cable is driven, such as in the direction indicated by the arrow in FIG. 12, the support assembly is correspondingly driven along guide shaft 90 in the same direction.

Figure 14:
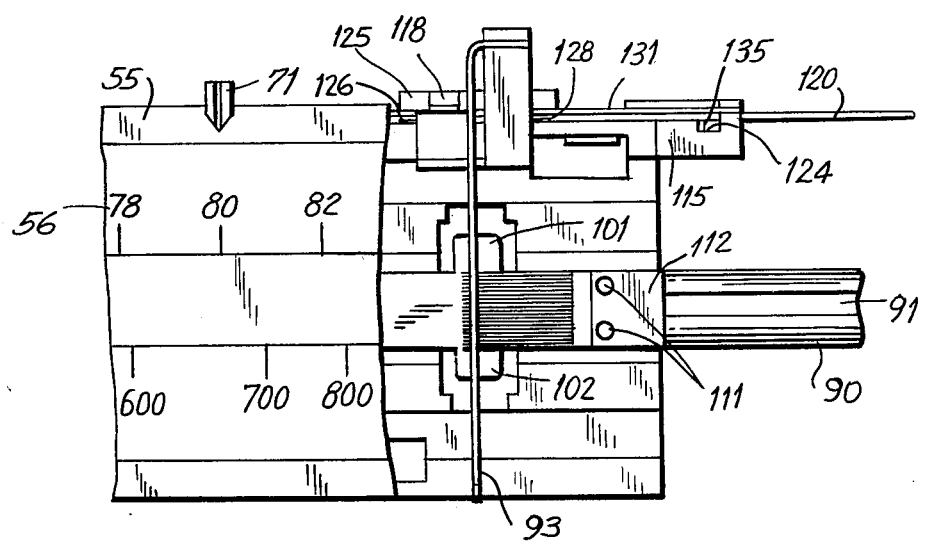

As best seen in FIGS. 13 and 14, when pointer assembly 104 is mounted upon support assembly 94, pointer 93 is aligned with the brushes of wiper element 112. Thus, as support assembly 94 is moved along guide shaft 90, pointer 93 scans indicia 56 provided on scale plate 50 so as to indicate the particular broadcast frequency to which the tuning apparatus is tuned. A multi-bit digital signal representing the indicated broadcast frequency is produced by the brushes of wiper element 112 because these brushes are in contact with the array of coded indicia 86 formed by parallel strips 87a . . . 87h of conductive and non-conductive segments. Thus, as support assembly 94 is moved, wiper element 112 produces a digital signal which identifies the particular broadcast frequency with which pointer 93 is aligned.

It is recognized that base 95 is provided with apertures 97a and 97b for receiving guide shaft 90. Projections 101 and 102 cooperate with upper and lower guide rails 60 and 61 to prevent any rotation of base 95 about the guide shaft. Thus, and as mentioned hereinabove, projections 101 and 102 serve to stabilize support assembly 94 as this support assembly is supported upon and slidably driven along guide shaft 90.

In order to facilitate the insertion of plate 131 into pointer mounting clip 103 and to assemble pointer assembly 104 onto base 95, plate 131 and gooseneck extension 133 preferably are of a resilient material, such as a spring metal, a synthetic resin, or the like. It is appreciated that, in order to remove pointer assembly 104 from base 95, the reverse of the aforementioned assembly steps are followed.

As mentioned above, base 95 defines a housing 105 for light switch 106. This housing is shown more particularly in FIG. 18. Base 95 includes an upper wall 142, which also defines upper portion 115, a lower wall 143 and side walls 144 and 145 so as to define a box-like housing. Opening 146 extends from the top to the bottom of this box-like housing and, as mentioned previously, forms the bifurcated bracket 96 by separating legs 96a and 96b. Upper wall 142 is provided with a releasable catch 147 and, similarly, lower wall 143 is provided with a releasable catch 148. These releasable catches are similar to each other and each is shown as a flexible leg terminating in a wedge-shaped hook 149 and 150, respectively.

Figure 19:
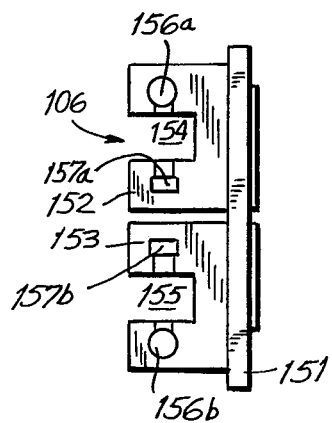
FIG. 19 is a side view of the light switch which is used with the support assembly in accordance with this invention.
Figure 15:
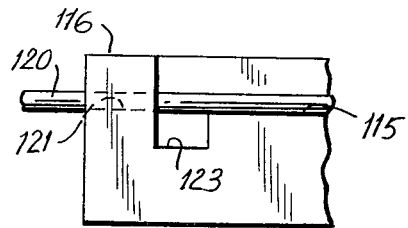
Figure 16:
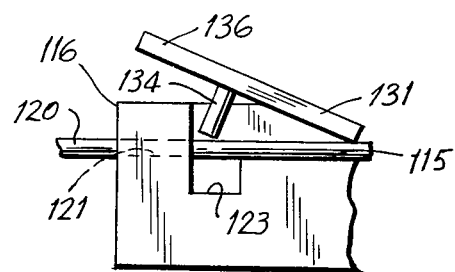
Figure 17:
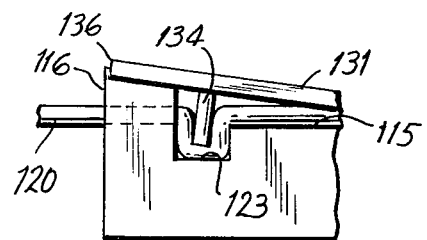

Light switch 106 is formed of a back plate 151, upon which a printed circuit is provided, as shown. As illustrated more particularly in FIG. 19, and also in FIG. 2, the light switch includes two C-shaped housings 152 and 153, secured to back plate 151 and disposed one atop the other. C-shaped housing 152 is provided with a gap 154 between its upper and lower legs; and, similarly, C-shaped housing 153 is provided with a gap 155 between its upper and lower legs. When light switch 106 is inserted into housing 105, the C-shaped housings are positioned within opening 146. Furthermore, gaps 154 and 155 are aligned with gaps 107 and 108, respectively. That is, gap 154, which is provided between the upper and lower legs of C-shaped housing 152, is aligned with gap 107 which is provided between the upper and middle legs of E-shaped base 95. Also, gap 155, which is provided between the upper and lower legs of C-shaped housing 153, is aligned with gap 108 which is provided between the middle and lower legs of E-shaped base 95.

Light switch 106 further includes a light source and a light sensor contained in each C-shaped housing. In particular, light source 156a is optically aligned with light sensor 157a in C-shaped housing 152, the light source and light sensor being separated by gap 154. Similarly, light source 156b is in optical alignment with light sensor 157b in C-shaped housing 153, the light source and light sensor being separated by gap 155.

As shown in FIG. 20, in order to assemble light switch 106 in housing 105, the light switch is inserted into opening 146. Thus, C-shaped housings 152 and 153 are positioned in the central portion of housing 105. When back plate 151 reaches hooks 149 and 150, respectively, releasable catches 147 and 148 are spread apart so that the back plate can abut against the edges of upper and lower walls 142 and 143 and side walls 144 and 145. Then, releasable catches 147 and 148 are released so that hooks 149 and 150 releasably grip the rear surface of back plate 151. In the event that a light source 156a, 156b or a light sensor 157a, 157b must be replaced, light switch 106 can be removed from housing 105 merely by spreading releasable catches 147 and 148 apart so that hooks 149 and 150 release back plate 151; and then by sliding light switch 106 rearwardly out of housing 105.

Each of light sources 156a, 156b may comprise a suitable light-emitting element, such as a light emitting diode (LED) an incandescent lamp, or the like. Each light sensor 157a, 157b may comprise a suitable photodetecting device, such as a photo-transistor, a photo-sensitive resistor, or the like.

In order that back plate 151 is secured firmly to the upper, lower and side walls which define housing 105, releasable catches 147 and 148 preferably are disposed at diagonally opposite corners of the box-like housing, as shown in FIGS. 18 and 22. As may be appreciated, these releasable catches should be formed of resilient material, such as spring metal or, preferably, a synthetic resin. FIG. 22 also illustrates another embodiment of back plate 151'. In the embodiment of FIG. 18, back plate 151 is illustrated as being substantially rectangular. In FIG. 22, the back plate is illustrated as being substantially rhomboid in shape. Diagonally opposite corners of back plate 151' are, nevertheless, secured by hooks 149 and 150 of releasable catches 147 and 148. If back plate 151 (or 151') is dimensioned to fit within the rectangular opening defined by upper, lower and side walls 142-145, stops 145a may be provided, as shown in FIG. 18, against which the inner surface of the back plate abuts.

Light source 156a and light sensor 157a constitute one switch and light source 156b and light sensor 157b constitute another switch. As will be discussed in greater detail below, the first-mentioned switch is associated with the FM frequency band and the second-mentioned switch is associated with the AM frequency band. When light from, for example, light source 156a impinges upon light sensor 157a, the switch defined thereby is closed so as to mute the signal output of the tuning apparatus. When light is blocked from impinging upon light sensor 157a, the light switch is opened so as to terminate, or release, this muting operation. It may be appreciated that the presence of a projection 172, mounted on the rear portion of a marker 66, when inserted within gap 154 or within gap 155 serves to block light from impinging upon light sensor 157a or light sensor 157b, thereby opening the respective switch.

As mentioned briefly hereinabove, key 160 is provided to be selectively inserted into aperture 73 of a marker 66 so as to engage the marker and thereby position the same to a desired location along upper or lower guide rails 60 and 61, relative to indicia 56 on scale plate 55. Key 160, which is shown in FIG. 2, is shown in greater detail in FIGS. 12 and 23-26. This key is slidably mounted on guide shaft 90 and is disposed between legs 96a and 96b of bifurcated bracket 96. Key 160 includes an arcuate gripping member 161 whose free end portions are separated by an angle of about 100°. Gripping member 161 is made of a resilient material, such as a synthetic resin, and includes a nub 162 projecting in a radially inward direction. As shown in FIG. 23, nub 162 is adapted to be inserted into longitudinal groove 91 of guide shaft 90.

The key additionally includes an engaging member 163 secured to gripping member 161. Engaging member 163 is a bar extending in a radially outward direction from the gripping member, this engaging member being positioned between legs 98 and 99 of support assembly 94, as shown in FIG. 12. Engaging member 163 is provided with chamfered edges 164 so as to taper the engaging member in the upper and lower portions thereof. In addition, the front end, or nose, of the engaging member also is chamfered upward and downward from a diametrically central location, as shown in FIGS. 23-26. By sloping the side and front edges of engaging member 163, the engaging member can be inserted easily into aperture 73 of a marker 66.

In securing key 160 to guide shaft 90, support assembly 94 first is mounted on the guide shaft. Then, and as shown in FIGS. 24 and 25, the key is brought into position relative to the guide shaft. The free ends of arcuate gripping member 161 are displaced from each other so as to fit about guide shaft 90, as shown in FIG. 25. Then, key 160 is pushed further onto the guide shaft such that nub 162 is inserted into groove 91. The free ends of gripping member 161 then will form about the guide shaft so as to grippingly engage the shaft and thereby secure key 160 thereon.

Since the key is disposed between legs 98 and 99 of support assembly 94, it is appreciated that, as the support assembly moves along guide shaft 90, key 160 is pushed thereby such that the key also slides along the guide shaft. As shown in FIGS. 2 and 11, the key is positioned between rail extensions 64 and 65 of upper and lower guide rails 60 and 61, respectively. When support assembly 94 is positioned such that pointer 93 is in alignment with indicator 71 of a marker 66, guide shaft 90 is rotated, as will be explained below, so as to correspondingly rotate key 160. If the guide shaft is rotated in the clockwise direction, engaging member 163 is inserted into aperture 73 of a marker 66 which is mounted on the upper guide rail. That is, the engaging member is inserted into the aperture of a marker associated with the FM frequency band. Conversely, if guide shaft 90 is rotated in the counterclockwise direction, key 160 likewise is rotated in this same direction such that engaging member 163 is inserted into aperture 73 of a marker 66 associated with the AM frequency band. Then, if guide shaft 90 is maintained in this rotated direction, that is, if key 160 is maintained in engagement with a marker 66, subsequent movement of support assembly 94 will push key 160 so as to slide the engaged marker in the direction in which the support assembly is moved. Hence, marker 66 may be displaced to any other desired location, that is, to any desired, preset station, represented by indicia 56 on scale plate 55.

It may now be appreciated that engaging member 163 would be mis-aligned with aperture 73 of a marker 66 if the marker is not stably mounted on the guide rail. That is, if the marker is twisted, as represented by the broken lines shown in FIG. 7, then, even though pointer 93 may be aligned with indicator 71, engaging member 163, which also is aligned with pointer 93, would not be in alignment with aperture 73. Thus, when guide shaft 90 is rotated, engaging member 163 would not be inserted into the aperture and, therefore, key 160 would not engage marker 66.

Figure 27:
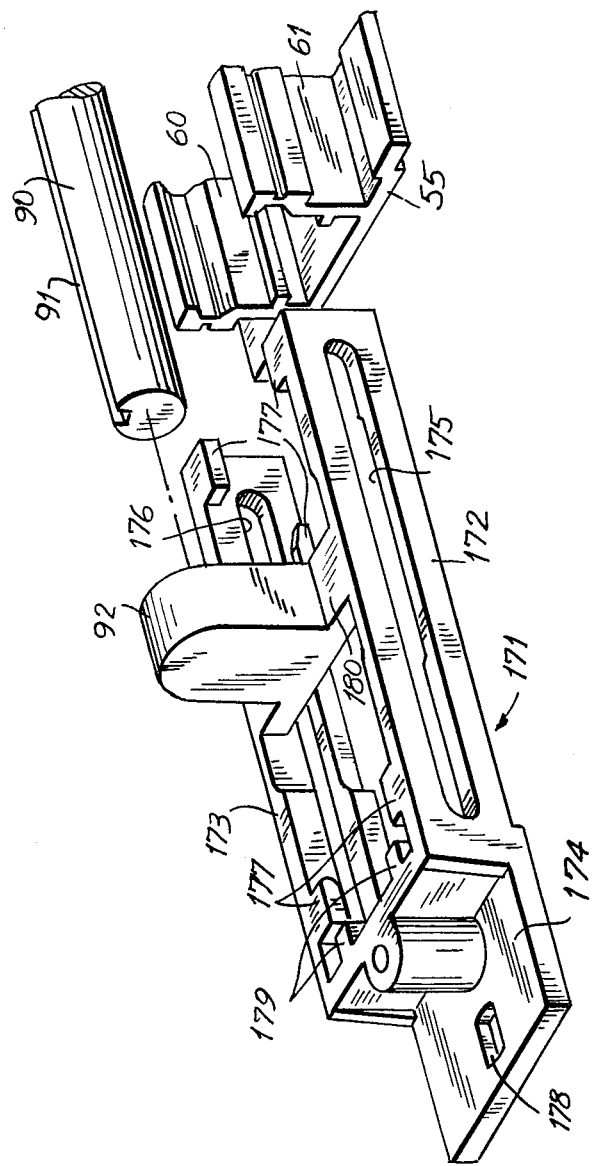
FIG. 27 is a perspective view of the socket and support bracket which are used for rotatably supporting the guide shaft in the apparatus of the present invention.
Figure 28:
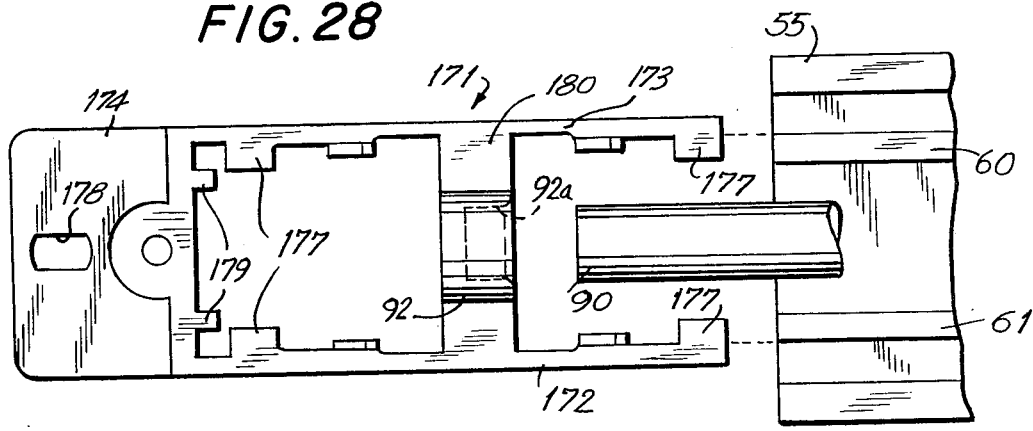
FIGS. 28 and 29 are top and sectional views of the socket and support bracket.
Figure 29:
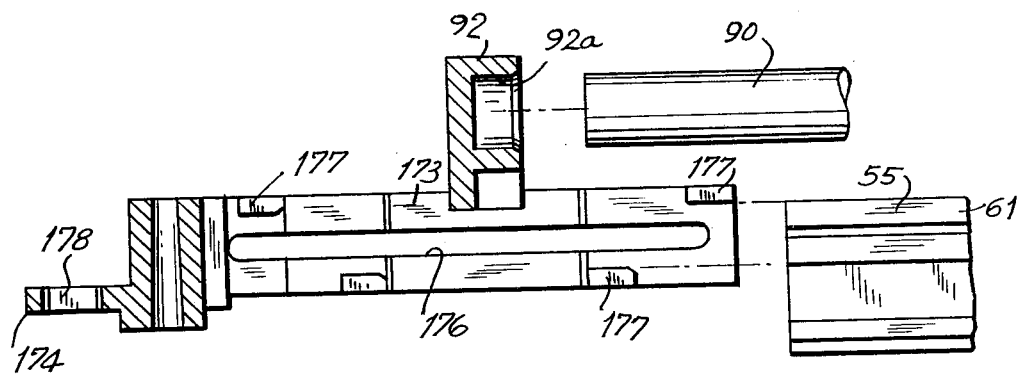

As shown in FIG. 11, one end of drive shaft 90 is supported in socket 92 and is rotatable therewith. FIGS. 27-29 illustrate this socket and a C-shaped support bracket 171 which, as shown in FIG. 11, is adapted to be secured to scale plate 55 and to front panel 52 or to the chassis of the tuning apparatus. As shown in FIG. 27, socket 92 is adapted to receive guide shaft 90. The socket is mounted on support bracket 171 via a bridge member 180 which extends across the two legs of the C-shaped support bracket. When assembled, as shown in FIG. 11, socket 92 extends from support bracket 171 in the rearward direction.

The support bracket includes legs 172 and 173 which are joined, at one end thereof, by a cross member 174. The cross member is a relatively flat plate which includes a hole 178 for the purpose of affixing support bracket 171 to an appropriate member (such as the front panel or the chassis) of the tuning apparatus.

Each of legs 172 and 173 is provided with a slit 175, 176, respectively, to add resiliency to the legs, whereby support bracket 171 can be mounted over guide rails 60 and 61 of scale plate 55. In order to properly position the support bracket on the guide rails, projections 177 are provided at various locations on legs 172 and 173, as illustrated, to grip rail extensions 64 and 65.

As shown in FIGS. 28 and 29, socket 92 includes a recess 92a for receiving one end of guide shaft 90. Thus, the guide shaft is adapted to rotate within recess 92a. Each leg 172, 173 is provided with a given width which is greater than the width of rail extensions 64 and 65, respectively. Projections 177 are provided along opposite edges of each leg 172, 173, and thus are spaced from each other by about the width of each leg. This is shown more clearly in FIG. 29. When support bracket 171 is mounted upon scale plate 55, leg 172 engages guide rail 61 and leg 173 engages guide rail 60. More particularly, rail extension 65 is inserted between projections 177 of leg 173, which projections are spaced apart by the width of the leg. Hence, these projections serve to grip rail extension 64 therebetween. Similarly, projections 177 which are provided on leg 172 serve to grip rail extension 65 of guide rail 61. Once support bracket 171 is mounted upon scale plate 55 in this manner, the support bracket can be affixed to the chassis of the tuning apparatus by a screw passing through hole 178 in cross member 174. Then, guide shaft 90 is inserted into recess 92a of socket 92.

As shown in FIGS. 27-29, ribs 179 are provided along the joining member in the C-shaped bracket between legs 172 and 173. These ribs serve as stop members against which scale plate 55 abuts when the scale plate and support bracket 171 are assembled to each other. Then, scale plate 55 is set to a proper, predetermined position when the assembly of the scale plate and support bracket are secured to front panel 52 or to the chassis of the illustrated tuning apparatus.

As mentioned above, and as illustrated in FIG. 11, the other end of guide shaft 90, that is, the end of the guide shaft which is remote from the end supported in socket 92, is supported in a rotatable support 181 which, in turn, is provided in a support structure 182. The purpose of rotatable support 181 is to receive an end of guide shaft 90 and, moreover, to be turned either in the clockwise or counterclockwise direction so as to impart a corresponding rotation to the guide shaft supported thereby. As will be explained below, this turning movement of rotatable support 181 is controlled from a remote location and, particularly, is controlled by the user of the tuning apparatus in response to his depression of operating switches 57 and 58 (FIG. 1).

Turning first to the construction of support structure 182, this structure is shown more particularly in FIGS. 30-33. Support structure 182 is similar to aforedescribed support bracket 171 in that the support structure is comprised of a substantially C-shaped member formed of legs 183 and 184, these legs being joined at one end thereof by a cross member 185. Leg 183 is provided with at least one length-wise slit 186 therein and, similarly, leg 184 also is provided with at least one lengthwise slit 187. As shown in FIG. 32, each leg may be comprised of two such slits disposed along a longitudinal axis and spaced from each other. These slits provide sufficient resiliency to legs 183 and 184.

Each leg of support structure 182 is provided with a number of projections 188, these projections being similar to aforementioned projections 177 and are provided for the same purpose. Thus, projections 188 on leg 184 are adapted to grip rail extension 64 of upper guide rail 60; and projections 188 on leg 183 are adapted to grip rail extension 65 on lower guide rail 61. Thus, support structure 182 is mounted upon scale plate 55 at an end of the scale plate remote from the end upon which support bracket 171 is mounted. At the joining portion of the C-shaped support structure 182, that is, in the vicinity of cross member 185, ribs 190 are provided, these ribs facing toward scale plate 55 such that, when the support structure is mounted upon the scale plate, ribs 190 serve as stops against which the scale plate abuts. Consequently, when assembled, the scale plate is disposed in a desired, predetermined position with respect to support structure 182. Cross member 185 is provided with a hole 189, similar to hole 178 provided in cross member 174 of support bracket 171. A screw or other securing device can be used to pass through hole 189 so as to fix support bracket 182, together with scale plate 55 upon which the support bracket is mounted, to front panel 52 or the chassis of the illustrated tuning apparatus. Thus, by reason of support bracket 171 and support structure 182 mounted upon opposite ends of scale plate 55, the scale plate is suitably positioned within window 53 of front panel 52 of the tuning apparatus.

Each leg 183 and 184 is provided with a respective elongated U-shaped bracket 192 and 191. When support structure 182 is properly mounted upon scale plate 55, U-shaped bracket 191 opens in the downward direction and U-shaped bracket 192 opens in the upward direction. Both brackets extend rearwardly of scale plate 55. Each U-shaped bracket 191 and 192 is of similar construction and, in the interest of brevity, only bracket 191 is described in detail. Bracket 191 is shown in the sectional view of FIG. 32.

As illustrated, U-shaped bracket 191 is provided with an arm 195, this arm extending rearwardly when support structure 182 is mounted upon scale plate 55, and this arm also serving as the base of the U-shaped bracket. A longitudinal slit 196 is provided in arm 195, and side members 197 and 198 extend from opposite lengthwise edges of arm 195. These side members 197 and 198 constitute the legs of the U-shape. A pair of slots 199 is provided in side members 197 and 198, respectively, these slots being located in the vicinity of leg 183 upon which the U-shaped bracket 191 is mounted, and these slots extending through arm 195, as shown in FIG. 32.

U-shaped bracket 192, which is of similar construction, cooperates with U-shaped bracket 191 to support a support ring member 193 therebetween. This support ring member is adapted to receive rotatable support 181 and is comprised of a cup-shaped member 200, shown more clearly in FIG. 32, the opening of the cup-shaped member extending in the direction toward socket 92. Cup-shaped member 200 includes an end base 201, shown also in FIG. 33, this end base being provided with a circular aperture 202 whose diameter is less than the diameter of the opening of cup-shaped member 200. Cut-out portions 203 and 204, shown more clearly in FIG. 33, are provided in end base 201 and are diametrically opposite to each other so as to extend the diameter of circular aperture 202 at the locations of these cut-out portions. A pair of slots 194 is provided in the peripheral wall of cup-shaped member 200, these slots being diametrically opposed to each other and, as shown in FIG. 30, may be on the same diameter as cut-out portions 203 and 204.

Figure 30:
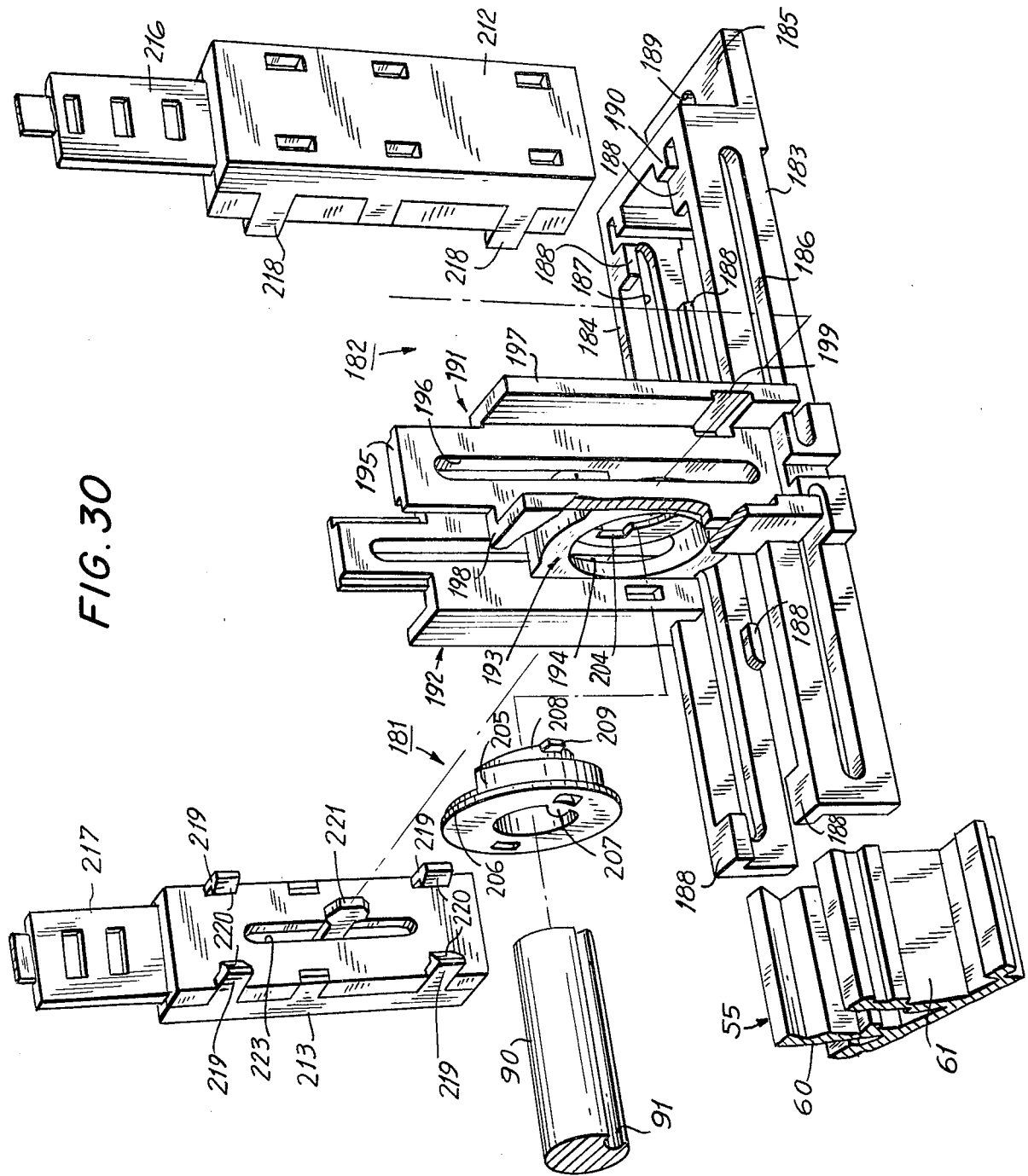
FIG. 30 is a perspective, exploded view of the rotatable support and support structure which are used to supportably drive the guide shaft in the apparatus of the present invention.
Figure 34:
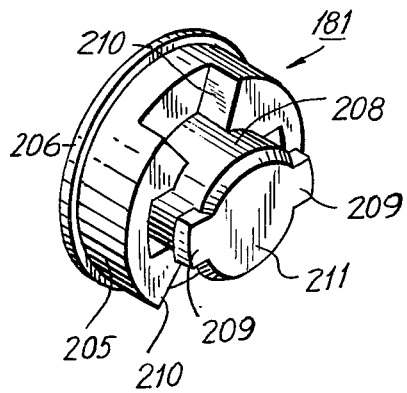
FIG. 34 is a perspective view of the rotatable support shown in FIG. 30.
Figure 35:
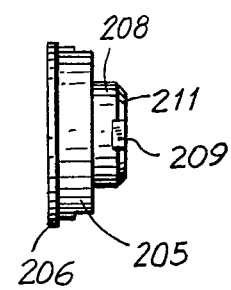
FIGS. 35-37 are side, rear and front view of the rotatable support.
Figure 36:
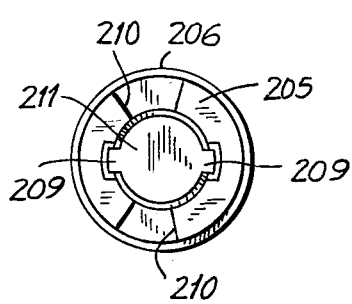
Figure 37:
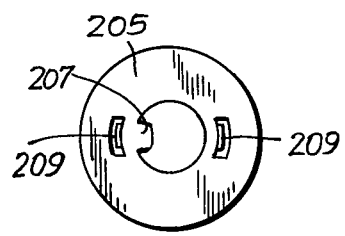
Figure 38:
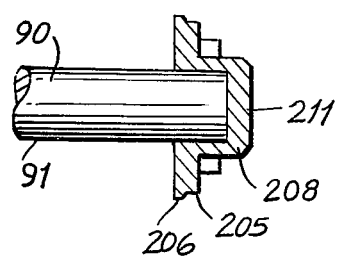
FIG. 38 is a sectional view representing the manner in which the guide shaft is rotatably supported in the rotatable support.

Rotatable support 181 which is shown in FIG. 30 in exploded form with respect to support structure 182, and which is shown in greater detail in FIGS. 34–38, is comprised of two circular cylinders, or members, 205 and 208. These circular members are concentric with each other and are arranged to be axially adjacent, or axially overlapped with each other, as shown in FIGS. 34 and 35. Circular member 205 is provided with a circular flange 206 on the periphery thereof. The diameter of circular flange 206 obviously is greater than the outer diameter of circular member 205. A nub 207, shown in FIGS. 30 and 37, is provided on the inner wall, or cavity, of circular member 205. A pair of arcuate cut-out portions 210 is provided in the outer wall of circular member 205, as shown in FIGS. 34 and 36. These cut-out portions are opposite to each other and are angular displaced by about 180° or less.

Circular member 208 is disposed behind circular member 205 and has an outer diameter which is less than the outer diameter of circular member 205. The inner diameter of circular member 208 is equal to the inner diameter of circular member 205. Circular member 208 is provided with a base 211 so as to provide an end cap to the rotatable support which receives guide shaft 90. Projections 209 are provided on end cap 211, these projections extending radially outward from the base and being diametrically opposed to each other. It may be appreciated that, in assembly, that is, when rotatable support 181 is assembled with support structure 182, projections 209 are accommodated by cut-out portions 203 and 204 in end base 201.

An alternative construction of rotatable support 181 is comprised of an inner cylindrical member, corresponding to circular member 208, and an outer cylindrical member, corresponding to circular member 205, the outer cylindrical member circumscribing the inner cylindrical member and having an axial length which is less than the axial length of the inner cylindrical member. A flange, similar to flange 206, is provided on the outer cylindrical member; and arcuate cut-out portions 210 also are provided in the peripheral wall of the outer cylindrical member. One end of the inner cylindrical member is sealed with an end cap, similar to base 211, this end cap having projections, or wings, extending radially outward therefrom, similar to projections 210. In either embodiment, guide shaft 90 is received by the interior opening, or cavity, which is provided in circular members 205 and 208, or which is provided in the inner cylindrical member, with nub 207 being inserted into groove 91.

In assembling rotatable support 181 to support structure 182, the rotatable support is inserted through the opening of cup-shaped member 200, with base 211 passing through this opening first. Rotatable support 181 is aligned such that projections 209 extending from base 211 pass through cut-out portions 203 and 204, these latter cut-out portions being provided in end base 201 of support ring member 193. The outer diameter of circular member 208 is less than the inner diameter of circular aperture 202; and the outer diameter of circular member 205 is less than the inner diameter of the opening of cup-shaped member 200. Hence, rotatable support 181 is easily received in cup-shaped member 200. Since projections 209 on base 211 pass through cut-out portions 203 and 204, base 211 extends rearwardly of circular aperture 202. The diameter of circular flange 206 is greater than the opening of cup-shaped member 200 and, therefore, this flange abuts against the peripheral wall of the cup-shaped member. Rotatable support 181 now is rotated by about 90° so that projections 209 abut against end base 201 of cup-shaped member 200. Thus, the cup-shaped member is sandwiched between flange 206 and projections 209. Rotatable support 181 is rotated sufficiently such that arcuate cut-out portions 210 provided in the outer peripheral wall of circular member 205 are aligned with slots 194 in the peripheral wall of cup-shaped member 200. In this alignment, and as will be explained, a finger 221 can extend through a slot 194 to be received by a cut-out portion 210.

In assembling guide shaft 90 to the tuning apparatus, support bracket 171, with socket 92 affixed thereto, may be mounted upon guide rails 60 and 61, and then guide shaft 90 may be inserted into socket 92. Then, support structure 182, with rotatable support 181 assembled therewith, may be slid onto guide rails 60 and 61. At the same time, rotatable support 181 slides into receiving relationship with the other end of guide shaft 90 such that nub 207 is inserted into groove 91. Hence, as support structure 182 is mounted upon guide rails 60 and 61, the open end of rotatable support 181 slides onto guide shaft 90. It is appreciated that, since nub 207 is received by groove 91, rotatable support 181 is keyed to guide shaft 90 such that any rotation in the rotatable support correspondingly rotates the guide shaft.

The manner in which rotatable support 181, and thus guide shaft 90 and key 160 are remotely controlled now will be described with reference to FIGS. 30 and 39. A housing 212 is mounted upon U-shaped bracket 191, and a similar housing 213 is mounted upon U-shaped bracket 192. In particular, housing 212 is provided with legs 218 and, similarly, housing 213 is provided with legs 219. Each housing is a substantially rectangular-shaped block structure with legs 218 and 219 respectively extending from one surface of that structure. Each of legs 218 and 219 terminates in a hook member, for example, hook member 220 which is provided at the free end of each leg 219. Hook member 220 is wedge-shaped and is seen to be similar to aforedescribed hooks 149 and 150 provided on releasable catches 147 and 148 of support assembly 94. A pair of legs 218 of housing 212 is adapted to be inserted into corresponding slots 199 which are provided in side members 197 and 198, respectively, of U-shaped bracket 191. Similar slots are provided in the side members of U-shaped bracket 192 for receiving a pair of hook members 220 which are provided on one pair of legs 219 of housing 213. Hook members 220, provided on another pair of legs 219, are adapted to engage the lip or rim of the central arm, such as arm 195 of U-shaped bracket 193. With respect to housing 212, it is seen that the uppermost pair of legs 218 is positioned beyond side members 197 and 198 of U-shaped bracket 191.

A respective finger 221, 222 is disposed within each housing 212 and 213 and, as shown with respect to housing 213, finger 221 projects therefrom through slot 223. When housings 212 and 213 are mounted upon U-shaped brackets 191 and 192, respectively, in the manner described above, respective fingers 221, 222 project through slits, such as slit 196, provided in each arm, such as arm 195, of U-shaped brackets 191 and 192. These fingers further extend through slots 194 which are provided in the peripheral wall of cup-shaped member 200. Hence, fingers 221, 222 extend from housings 212 and 213 into arcuate cut-out portions 210 so as to be in driving engagement with rotatable support 181.

Fingers 221, 222 are controlled in response to the manual operation of operating switches 57 and 58, shown in FIG. 1. These operating switches, reproduced in FIG. 39, are, for example, releasable push-button switches which, when depressed, operate to move the respective finger 221 or 222 in housing 212 or 213, respectively. To this effect, transmission straps 216 and 217 are connected between housings 212, 213 and operating switches 57, 58, respectively. A securing block 214 is mechanically coupled to operating switch 57 to receive transmission strap 216; and, similarly, a securing block 215 is coupled to operating switch 58 to receive transmission strap 217. These transmission straps may be of the conventional type including pins and slots which cooperate with engaging mechanisms within the securing block at one end thereof and the housing at the other end thereof such that when an operating switch is depressed, the finger associated with that switch is moved. A spring release mechanism also may be provided, whereby when the depressed operating switch is released, the transmission strap returns to its normal, quiescent position, thereby also returning the finger connected thereto to its normal, quiescent position.

Figure 39:
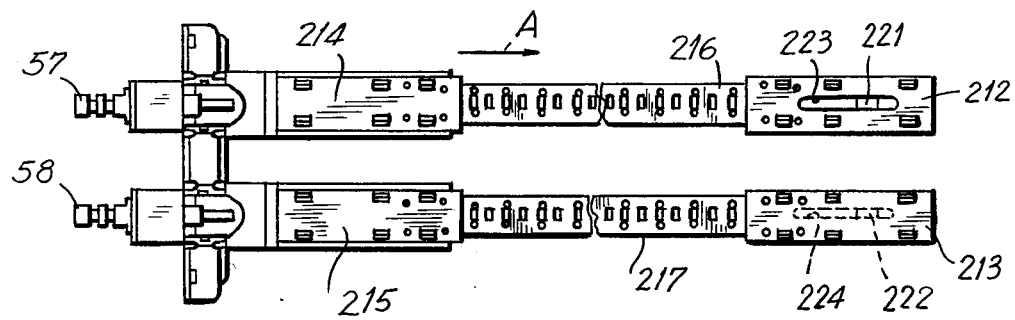
FIG. 39 represents the remote control apparatus which is used to rotatably drive the guide shaft in the apparatus of the present invention.
Figure 40:
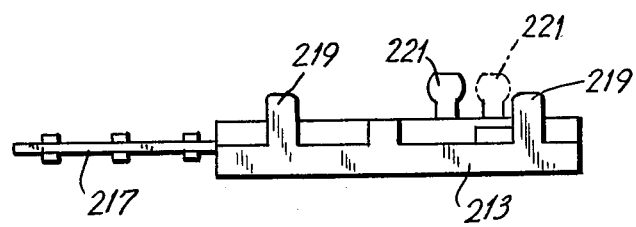
FIGS. 40 and 41 are side and front views of the securing block which is used in the remote control apparatus.
Figure 41:
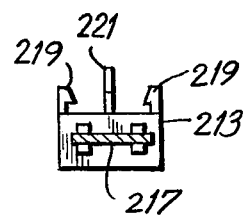

FIG. 40 is a side view of housing 213 wherein finger 221 is shown, by broken lines, in its active position in response to the forward movement of strap 217, that is, movement of the strap in the direction indicated by the arrow A in FIG. 39. FIG. 41 is an end view of housing 213, showing strap 217 and finger 221. FIG. 11 shows the assembly of housings 212 and 213 which are coupled to securing blocks 214 and 215 via transmission straps 216 and 217, respectively. It is, of course, recognized that securing blocks 214 and 215 terminate in operating switches 57 and 58, respectively, these switches being provided on front panel 52, as shown in FIG. 1.

Figure 42:
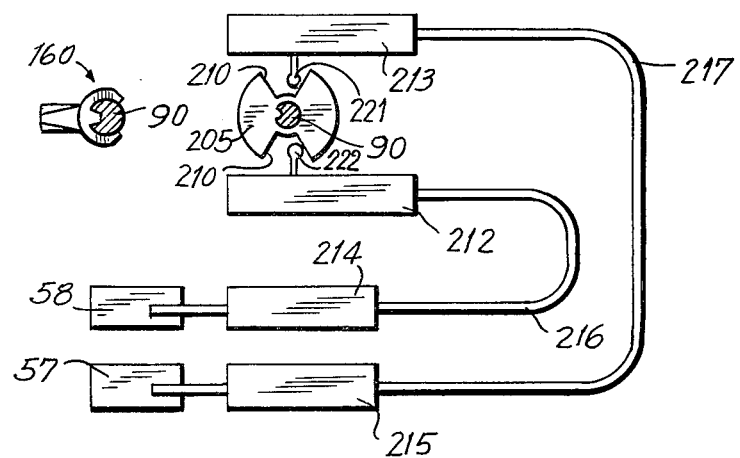
FIGS. 42-44 represent the manner in which the remote control apparatus rotatably drives the guide shaft and, in turn, the key, whereby a marker can be preset to any desired location.
Figure 43:
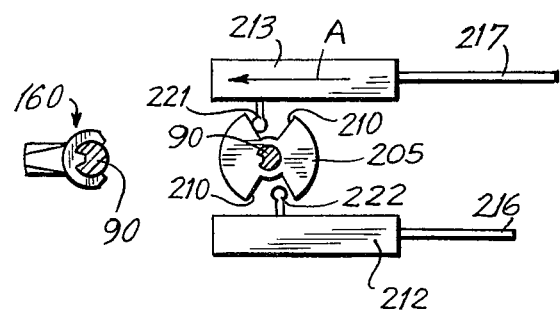
Figure 44:
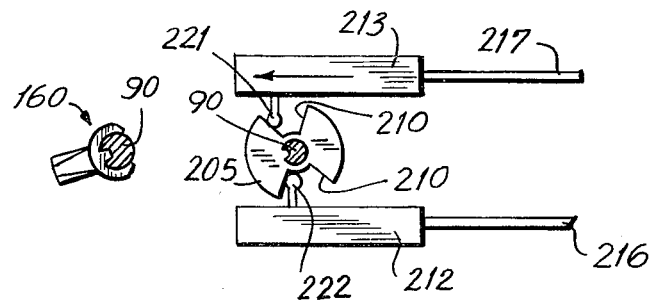

The manner in which operating switches 57 and 58 are used now will be described with reference to FIGS. 42–44. Let it be assumed that a marker 66 associated with, for example, the AM frequency band, is to be moved from one station-identifying location to another. Tuning knob 59 is operated so as to drive cable 120, thereby moving support assembly 94 along guide shaft 90. When pointer 93 is aligned with indicator 71 of the appropriate marker, tuning knob 59 no longer is operated. Instead, operating switch 57 is depressed, thereby moving transmission strap 217 in the forward direction, that is, in the direction from securing block 215 toward housing 213. This, in turn, moves finger 221, projecting from housing 213 into arcuate cut-out portion 210 of circular member 205 included in rotatable support 181, in the right-to-left direction, as viewed in FIGS. 42–44, and as indicated by arrow A in FIG. 43. This, in turn, rotates rotatable support 181 in the counterclockwise direction, as shown in FIG. 44. Accordingly, drive shaft 90 also is rotated in the counterclockwise direction, whereby key 160, which is secured to guide shaft 90, also is rotated in this direction. Consequently, engaging member 163 of key 160 is inserted into aperture 73 of the marker with which the key is aligned, that is, the marker whose indicator 71 is juxtaposed with pointer 93.

Once marker 66 is engaged by key 160 in the foregoing manner, tuning knob 59 may be rotated so that support assembly 94 again is driven along guide shaft 90, either toward the right or toward the left, as desired by the user. As support assembly 94 is driven, key 160 is pushed by the support assembly, whereby marker 66 slides along lower guide rail 61 to any additional desired position.

When support assembly 94 reaches a preferred position along scale plate 55, as indicated by the particular indicium 56 aligned with pointer 93, and thus with indicator 71, the depressed operating switch 57 can be released. This, in turn, returns transmission strap 217 to its normal, quiescent position, whereby finger 221 projecting from housing 213 moves in the left-to-right direction so as to be restored to its normal position. When the finger moves in this direction, it contacts the right-most edge of arcuate cut-out portion 210 so as now to rotate rotatable support 181 in the clockwise direction. This, in turn, rotates guide shaft 90 and key 160 in the clockwise direction. Consequently, engaging member 163 is withdrawn from aperture 73, thereby disengaging key 160 from marker 66. The marker now remains at its present position, thus representing a desired broadcast frequency, or AM station, to which the illustrated tuning apparatus may be tuned. Of course, if it is desired to alter the position of this marker, the foregoing operation can be repeated, whereby operating switch 57 is depressed so as to engage key 160 with this marker and thereby enable the marker to be displaced when tuning knob 59 is rotated.

An operation similar to the aforedescribed is performed in the event that a marker 66 associated with the FM band is to be adjusted, or positioned, to a location along scale plate 55 corresponding to a desired FM broadcast frequency. It is, of course, appreciated that when operating switch 58 is depressed, finger 222, projecting from housing 212, moves in the right-to-left direction (as viewed in FIGS. 42–44) so as to rotate rotatable support 181 in the clockwise direction. This, in turn, rotates guide shaft 90 and key 160 in the clockwise direction. Hence, engaging member 163 of key 160 is inserted into aperture 73 of a marker 66 mounted on upper guide rail 60, whereby the key engages this marker. Then, if tuning knob 59 is rotated, support assembly 94 and key 160 are driven along guide shaft 90 in the desired direction. This, in turn, slides marker 66 along upper guide rail 60. When indicator 71 of marker 66 is juxtaposed with an indicium corresponding to a desired FM broadcast frequency, or station, operating switch 58 is released so as to disengage key 160 from marker 66. The marker then remains at this location, thereby indicating the particular broadcast frequency to which the tuning apparatus may be tuned.

Figure 45:
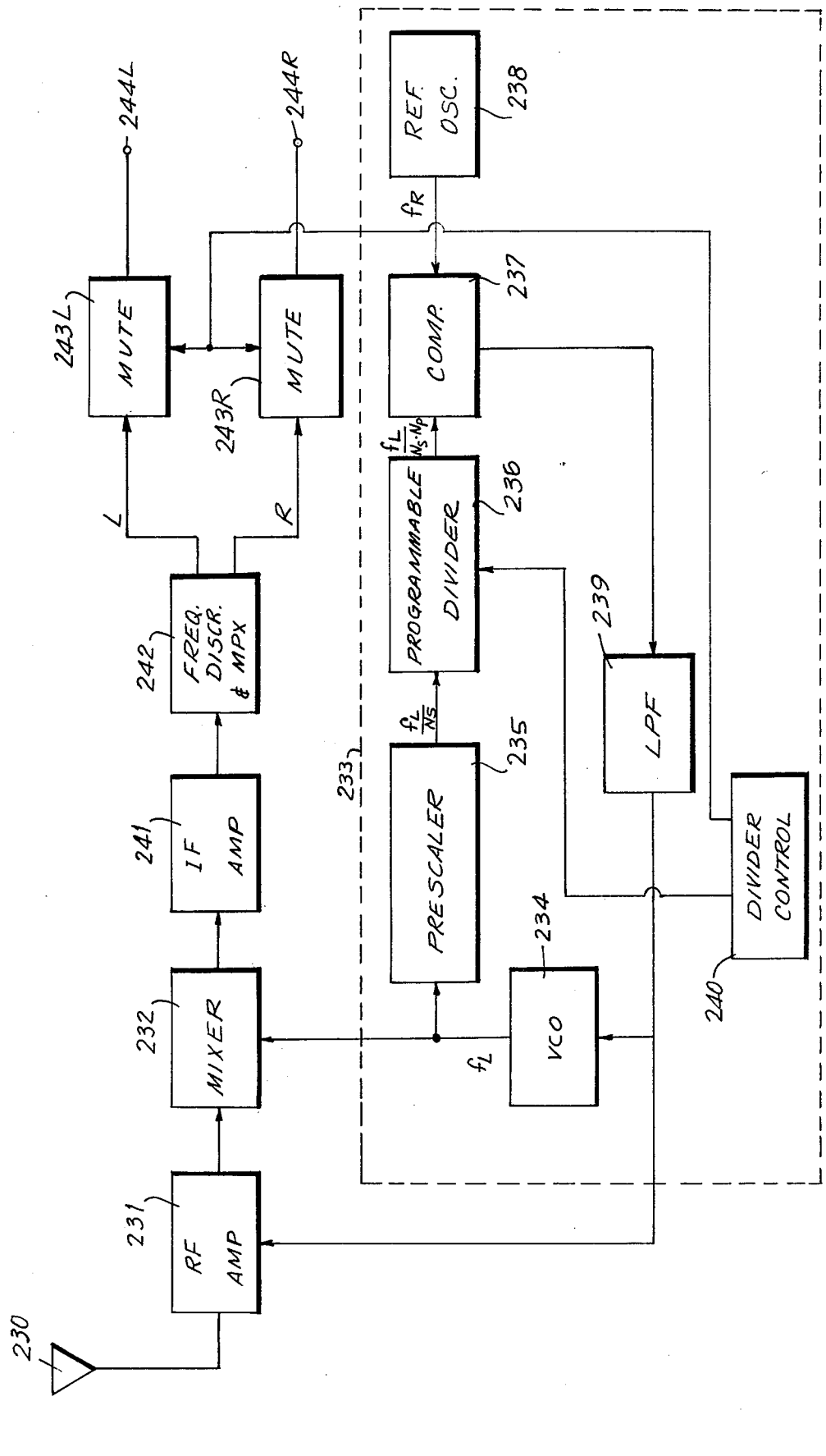
FIG. 45 is a block diagram of the electronic circuitry used in the tuning apparatus of the present invention.

Turning now to FIG. 45, there is illustrated a block diagram of the electronic circuitry included in tuning apparatus 50. This circuitry is comprised of an RF amplifier 231, a mixer 232, a phase-locked loop 233, an IF amplifier 241, a frequency discriminator and demultiplexer 242 and muting circuits 243L and 243R. For the purpose of the present discussion, the circuitry illustrated in FIG. 45 is associated with the FM tuning portion of the tuning apparatus and is adapted to supply left and right channel information signals when an FM stereo signal is received. However, and as should be appreciated, the illustrated circuitry can be used in the AM tuning section, merely by replacing frequency discriminator and demultiplexer 242 with an AM detector. RF amplifier 231 is coupled to an antenna 230 for receiving the broadcast frequency signal. If it is assumed that the illustrated circuitry is included in the FM tuning section, then the broadcast frequency is an FM broadcast frequency which, for example, in the United States may range from 88.1 MHz to 107.9 MHz, with adjacent channels, or stations, being separated by 200 KHz. RF amplifier 231 is conventional and is adapted to amplify the RF signal and supply same to mixer 232. The mixer is adapted to receive a local oscillating signal from phase locked loop 233 and to mix this local oscillating signal with the received broadcast frequency signal to produce an intermediate frequency (IF) signal. As is conventional, in an FM tuner, the IF frequency is equal to 10.7 MHz. This IF signal is, in turn, supplied to IF amplifier 241 whereat it is amplified to a suitable level. The output of IF amplifier 241 is coupled to frequency discriminator and demultiplexer 242 wherein the frequency-modulated information contained in the amplified IF signal is demodulated. Furthermore, if the broadcasted FM signal is a stereo signal, frequency discriminator and demultiplexer 242 functions in the conventional manner to recover the separate left and right channel signals (L) and (R) from the demodulated signal. For example, and as is conventional, the demodulated FM signal may include the so-called monaural component (L+R) and the so-called stereo component (L−R), these monaural and stereo components being formed of separate signals which are frequency-modulated onto different subcarriers. These recovered monaural and stereo components then are summed to produce the left-channel signal information L, and are subtracted to produce the right-channel signal information R. The left-channel and right-channel outputs of frequency discriminator and demultiplexer 242 are coupled to muting circuits 243L and 243R, respectively. The output of muting circuit 243L is connected to a left-channel output terminal 244L, and the output of muting circuit 243R is connected to a right-channel output terminal 244R. These output terminals are connected to further circuitry (not shown) for additional processing, such as further amplification to drive suitable loudspeakers, or the like.

Phase-locked loop 233 comprises the frequency synthesizing portion of the illustrated tuning circuitry. In prior art tuners, the local oscillating signal which is supplied to, for example, mixer 232 is produced by an oscillator whose resonant circuit includes a so-called air-capacitor. The local oscillating frequency is changed, so as to tune the tuning circuitry to different broadcast frequencies, by changing the capacitance of the aircapacitor. In phase-locked loop 233, the local oscillator signal supplied to mixer 232 is generated by a voltage-controlled oscillator (VCO) 234, and the frequency of the oscillating signal generated by VCO 234 is changed by changing the control voltage supplied thereto. Phase-locked loop 233 includes, in addition to VCO 234, a prescaler, or frequency divider, 235, a programmable frequency divider 236, a reference oscillator 238, a comparator 237 and a divider control circuit 240. Prescaler 235 is a frequency divider adapted to divide the frequency $f_L$ of the oscillating signal generated by VCO 234 by a predetermined amount $N_s$. Prescaler 235 thus may be a conventional frequency-dividing circuit. If the oscillating signal generated by VCO 234 is a sinusoidal signal, prescaler 235 may include a limiter circuit so as to convert the sinusoidal signal to a pulse signal, the output of the limiter circuit being connected to a conventional digital, or binary, divider. The output of prescaler 235 is coupled to programmable divider 236. This programmable divider is adapted to divide the frequency of the signal supplied thereto by prescaler 235 by a variable amount depending upon a dividing-control signal supplied thereto. This dividing-control signal is produced by divider control circuit 240, to be described. Programmable divider 236 may comprise a binary count-down counter whose count is counted in the downward direction in response to each pulse supplied thereto by prescaler 235. This count-down counter is located or preset, with the value of a selected dividing ratio by the divider control signal supplied thereto by divider control circuit 240. This dividing ratio is represented as $N_p$. Hence, the frequency of the signal supplied to programmable divider 236 by prescaler 235 is divided by the factor $N_p$, this factor being determined by the divider control signal established by divider control circuit 240.

The output of programmable divider 236 is coupled to one input of comparator 237. This comparator includes another input coupled to reference oscillator 238 for receiving a reference signal of frequency $f_R$ generated by the reference oscillator. Comparator 237 may comprise, for example, a phase comparator for determining whether the phase of the signal supplied by programmable divider 236 is equal to the phase of the signal supplied by reference oscillator 238. To this effect, phase-locked loop 233 functions in a manner whereby the frequency of the signal produced by programmable divider 236 always is made equal to the frequency $f_R$. The output of comparator 237 is fed back to VCO 234 via a low pass filter 239. Any phase differential between the signals supplied to phase comparator 237 is detected, and this phase differential results in an error signal which is applied to VCO 234 to vary the frequency $f_L$ of the oscillating signal produced by the VCO in a direction such that the phase differential is cancelled.

Divider control circuit 240 includes, for example, a storage register for receiving the multi-bit digital signal which is produced by wiper element 112 as that wiper element scans code plate 80. Divider control circuit 240 also includes a separate circuit which supplies a muting signal to muting circuits 243L and 243R in the event that light sensor 157a receives light from light source 156a. Although not shown herein, in a similar manner in the AM tuning section, a muting signal may be supplied to muting circuitry in the event that light sensor 157b receives light from light source 156b. Thus, if light is not blocked from the light source to the light sensor, muting circuit 243L and 243R are operative to prevent the recovered signal information produced by frequency discriminator and demultiplexer 242 from being supplied to output terminals 244L and 244R. Conversely, if light from the light source is blocked, as when projection 72 is inserted between the light source and light sensor, the muting signal is terminated and muting circuits 243L and 243R are inhibited. Consequently, the signal information which is recovered by frequency discriminator and demultiplexer 242 is enabled to be supplied to output terminals 244L and 244R.

The manner in which the tuning circuitry illustrated in FIG. 45 operates in tuning apparatus 50 now will be described. It is recalled that code plate 80 is provided with, for example, eight parallel strips 87a ... 87h, each strip containing conductive and non-conductive segments 88 and 89 which, when considered in a vertical line, that is, as contacted by wiper element 112, constitute an eight-bit digital signal. Each eight-bit digital signal, which is in inverted binary code, or Gray code, represents a particular FM broadcast frequency, or station. Thus, depending upon the Gray code signal which is produced by wiper 112, a corresponding station is selected. Furthermore, it is appreciated that the particular Gray code signal which is produced by wiper element 112 is determined by the position of that wiper element and, therefore, the position of support assembly 94. Of course, the position of the support assembly is represented by pointer 93 juxtaposed indicia 56 on scale plate 55. That is, the particular station with which pointer 93 is aligned is identified by the Gray code signal produced by wiper element 12. This Gray code signal is supplied to divider control circuit 240, the latter including suitable conversion circuitry for converting this Gray code signal to, for example, a binary code decimal (BCD) signal.

Let it be assumed that the relationship between the various broadcast frequencies, local oscillating frequency $f_L$, dividing ratio $N_p$ of programmable divider 236 and Gray code signal for the respective stations, or channels, is as indicated by the following table:

| $f_{in}$ (MHz) | $f_L$ (MHz) | $N_p$ | CH | GRAY CODE |
|---|---|---|---|---|
| 88.1 | 98.8 | 1976 | 1 | 0000 |
| 88.3 | 99.0 | 1980 | 2 | 0001 |
| 88.5 | 99.2 | 1984 | 3 | 0011 |
| 88.7 | 99.4 | 1988 | 4 | 0010 |
| 88.9 | 99.6 | 1992 | 5 | 0110 |
| 89.1 | 99.8 | 1996 | 6 | 0111 |
| 89.3 | 100.0 | 2000 | 7 | 0101 |
| 89.5 | 100.2 | 2004 | 8 | 0100 |
| . | . | . | . | . |
| . | . | . | . | . |
| 107.7 | 118.4 | 2368 | 90 | . |
| 107.9 | 118.6 | 2372 | 100 | . |

It has been assumed hereinabove that the Gray code signal is an eight-bit signal. For convenience, only four of those bits, for example, the four least significant bits, are illustrated in the above table. This table also represents the dividing ratio $N_p$ of programmable divider 236 which is necessary for receiving each available broadcast frequency $f_{in}$.

The operation of the tuning circuitry illustrated in FIG. 45 now will be described. Let it be assumed, initially, that tuning knob 59 has been operated such that support assembly 94 is at a location corresponding to an FM broadcast frequency of, for example, 88.3 MHz. In this position, pointer 93 will indicate, relative to indicia 56 on scale plate 55, that the broadcast frequency to which the tuning apparatus is tuned is equal to 88.3 MHz. Wiper element 112 will be in contact with parallel strips 87a ... 87h of code plate 80 so as to supply to divider control circuit 240 the Gray code which identifies this 88.3 MHz FM broadcast frequency. The frequency $f_L$ of the oscillating signal generated by VCO 234 first is divided by the factor $N_s$ in prescaler 235, thereby supplying an oscillating signal to programmable divider 236 having the frequency $f_L/N_s$. This frequency is further divided in programmable divider 236 by the dividing ration $N_p$, this dividing ratio being established by the Gray code signal supplied to divider control circuit 240 by wiper element 112. Hence, the frequency of the signal which is supplied to phase comparator 237 by the programmable divider is equal to $f_L/(N_s \cdot N_p)$.

The frequency of the signal supplied to phase comparator 237 by programmable divider 236 always should be equal to the reference frequency $f_R$ of the reference signal supplied to the phase comparator by reference oscillator 238. For the purpose of the present discussion, let it be assumed that this reference frequency $f_R$ is equal to 25. KHz. The dividing ratio $N_s$ of prescaler 235 is fixed and, in accordance with the present example, is equal to two. The dividing ratio $N_p$ of programmable divider 236 is, of course, variable; and is controlled by the particular Gray code which is supplied to divider control circuit 240 by wiper element 212. Furthermore, and is appreciated, in order to tune the illustrated tuning circuitry to any available FM broadcast frequency, the frequency $f_L$ of the oscillating signal generated by VCO 234 must be adjustable. This frequency $f_L$ may be expressed as follows:

$$f_L = N_s N_p f_R$$

In the present example, the following have been assumed:
$f_R = 25$ KHz;
$N_s = 2$;
$N_p = 1980$ Therefore, in accordance with the foregoing expression, $f_L = 99.0$ MHz. When the oscillating frequency $f_L$ is equal to 99.0 MHz, the lower sideband produced by mixer 232 is equal to the usual 10.7 MHz IF frequency provided that the FM broadcast frequency $f_{in}$ is equal to 88.3 MHz. Thus, when the frequency dividing ratio of programmable divider 236 is established at 1980, the illustrated tuning apparatus is tuned to the FM frequency of 88.3 MHz.

Now, let it be assumed that tuning knob 59 is operated such that support assembly 94 is positioned to a location whereby pointer 93 is in alignment with the indicium 107.7 MHz. In this position, the Gray code supplied by wiper element 112 from code plate 80 establishes the dividing ratio $N_p$ at 2368. In accordance with the foregoing expression for the frequency $f_L$ of the oscillating signal generated by VCO 234, for this dividing ratio of programmable divider 236, the oscillating frequency $f_L$ should be equal to 118.4 MHz. If the tuning condition of the tuning apparatus has been changed abruptly from the previous condition wherein the FM frequency of 88.3 MHz had been received, the frequency $f_L$ of the oscillating signal generated by VCO 234 may not be equal precisely to the proper frequency of 118.4 MHz. This possible phase difference is detected by phase comparator 237 which supplies a feedback control signal to low-pass filter 238, this feedback control signal serving to adjust the oscillating frequency of VCO 234. This feedback control adjusts the frequency $f_L$ of the oscillating signal generated by VCO 234 so as to be equal to 118.4 MHz. With this frequency, the illustrated tuning circuitry is tuned to an FM broadcast frequency of 107.7 MHz, which FM broadcast frequency, when mixed with the local oscillating signal, results in the proper IF frequency of 10.7 MHz.

Let it be assumed that various ones of markers 66 upon upper guide rail 60 have been preset to locations along the upper guide rail corresponding to preferred FM broadcast frequencies. The manner in which markers 66 may be preset has been described in detail hereinabove and, therefore, in the interest of brevity, will not be repeated. As one example, a marker 66 may be set to the FM broadcast frequency of 89.5 MHz. If the user wishes to receive the program information contained in this FM broadcast frequency, he need merely operate tuning knob 59 until pointer 93 is in alignment with indicator 71 on marker 66, which indicator is juxtaposed with the scale indication of 89.5 MHz. It is recognized that, when pointer 93 is in this location, support assembly 94 is disposed such that wiper element 112 detects a Gray code signal on code plate 80 that identifies the FM broadcast frequency of 89.5 MHz. As seen from the foregoing table, this Gray code signal sets the dividing ratio $N_p$ of programmable divider 236 to 2004. Accordingly, phase locked loop 233 controls the oscillating frequency $f_L$ of the signal generated by VCO 234 to be equal to 100.2 MHz. Thus, the illustrated tuning circuitry is tuned to the FM frequency of 89.5 MHz. Furthermore, since pointer 93 is in alignment with indicator 71, projection 72, which is provided on the same marker 66 as indicator 71, is positioned within gap 107 of base 95 and, also, within gap 154 of C-shaped housing 152. This projection blocks light from light source 156a from impinging upon light sensor 157a. Consequently, this switch formed of light source 156a and light sensor 157a is opened. When this switch is opened, muting circuits 243L and 243R (FIG. 45) are disabled. This means that the program information contained in the FM broadcast frequency of 89.5 MHz, that is, the broadcast frequency to which the tuning apparatus is tuned, can be supplied from frequency discriminator and demultiplexer 242 to output terminals 244L and 244R. Consequently, this program information drives loudspeakers, or the like, to be perceived by the user.

From the foregoing discussion, it is seen that muting circuits 243L and 243R operate to mute the output from frequency discriminator and demultiplexer 242 whenever light from light source 156a is not blocked from impinging upon light sensor 157a. That is, whenever a projection 72 is not inserted within gap 154, these muting circuits are operative to disable the tuning circuitry from producing an output at output terminals 244L and 244R. That is, if the tuning circuitry is tuned to a broadcast frequency that had not been preset by a marker 66, the tuning circuitry is effectively disabled. If desired, a suitable override switch can be provided, such as muting ON/OFF switch 51b, whereby this automatic control over muting circuits 243L and 243R is inhibited so that the user may, if desired, receive the program information which is broadcast over any receivable broadcast frequency, regardless of whether a marker 66 has been preset to that frequency. This override switch would, of course, be used initially to set up the various preset frequencies which the user may desire. Of course, when such an override switch is not operated, the tuning circuitry can be tuned rapidly and accurately to any preset frequency.

The foregoing explanation has described the operation of the tuning circuitry for receiving an FM broadcast frequency. It should be readily appreciated that a similar operation is carried out in order to receive an AM broadcast frequency. A separate AM tuning section may be provided in tuning apparatus 50, activated by FM/AM selector switch 51c, in order to receive the AM frequency band. Nevertheless, this separate AM tuning section will be substantially similar to the tuning circuitry illustrated and described in FIG. 45. Thus, a phase-locked loop may be provided in the AM tuning section in order to synthesize the local oscillating signal which is used to tune that section to a desired AM broadcast frequency. Also, when pointer 93 is in alignment with a marker 96 provided on lower guide rail 61, the muting circuit included in the AM tuning section will be disabled such that the tuning section will be enabled to supply the received program information to its output terminal.

Markers 66 provided on the upper and/or lower guide rails 60, 61 can be moved to any desired location relative to scale plate 55 merely by positioning key 160 in alignment with aperture 73 provided on leg 68, and then by operating one of operating switches 57 and 58 so as to rotate guide shaft 90 and thereby insert key 160 into this aperture. Then, if tuning knob 59 is rotated so as to drive support assembly 94 along guide shaft 90, key 160, which remains in engagement with the marker, will slidably displace the marker along its guide rail to any desired location. Release of operating switch 57 or 58 will return guide shaft 90 and key 160 to their respective quiescent positions. This disengages the key from aperture 73 in marker 66.

While the present invention has been particularly shown and described with reference to a preferred embodiment, various changes and modifications in form and details may be made without departing from the spirit and scope of the invention. Some of these changes and modifications have been discussed hereinabove. In addition to these, it is appreciated that, if desired, still other guide rails, similar to guide rails 60 and 61, may be provided, each additional guide rail being associated with a respective frequency band, such as a citizen's band, a short wave band, or the like. Markers, similar to aforedescribed markers 66, may be provided on these additional guide rails for positioning to any desired location so as to preset corresponding frequencies to which the tuning apparatus can be tuned. The manner in which these additional markers are positioned is similar to that described above. Additional code plates, similar to code plate 80, may be provided if the tuning apparatus includes additional tuning sections to be tuned to these additional frequency bands, and if such additional tuning sections are provided with frequency synthesizers similar to the frequency synthesizer discussed in FIG. 45. One or more of these tuning sections may, alternatively, be provided with conventional air-capacitors in place of such frequency synthesizers.

It is, therefore, intended that the appended claims be interpreted as including these, as well as the foregoing and other such changes and modifications.

What is claimed is:

1. Tuning apparatus, tunable to different broadcast frequencies for receiving signal information contained therein, comprising a scale provided with indicia corresponding to said broadcast frequencies; pointer means movable across said scale to indicate the particular broadcast frequency to which said tuning apparatus is tuned; movable support means for supporting said pointer means and for moving said pointer means across said scale; a plurality of marking means, each being settable to a desired position along said scale to represent a particular broadcast frequency to which said tuning apparatus is tunable; first guide means for guiding said support means; second guide means for guiding said marking means, said marking means being slidable on said second guide means; key means movable with said support means on said first guide means and selectively operative to engage a desired one of said marking means to move the engaged marking means therewith as said support means is set to a desired position by reason of said engagement with said key means; tuning circuitry having a controllable oscillator for generating an oscillating signal whose frequency is variable and determinative of the broadcast frequency to which said tuning apparatus is tuned, said tuning circuitry producing an output representing received signal information, and means for enabling said tuning circuitry to produce said output when said support means is moved into an aligned relationship with a respective one of said marking means.

2. The apparatus of claim 1 further comprising code means bearing encoded indicia representing said broadcast frequencies; and sensor means coupled to said support means for scanning said code means as said support means is moved to produce a control signal representing the particular broadcast frequency represented by the encoded indicia presently sensed by said sensor means, said control signal being supplied to said tuning circuitry to establish the frequency of said oscillating signal.

3. The apparatus of claim 2 wherein said indicia comprise a pattern of conductive elements; and wherein said sensor means comprises a wiper movable across said pattern of conductive elements to produce a plural-bit digital control signal as determined by the particular pattern of conductive elements presently sensed by said wiper.

4. The apparatus of claim 3 wherein said pattern of conductive elements comprises a plurality of parallel strips, each strip containing conductive and non-conductive segments and each strip corresponding to a respective bit in said pluralbit digital control signal; and wherein said wiper comprises a plurality of brush elements, each brush element being aligned with and movable along a respective one of said parallel strips.

5. The apparatus of claim 2 wherein said code means comprises a plate on which said encoded indicia are supported, said plate being disposed adjacent said scale to position said indicia in facing relation with said support means.

6. The apparatus of claim 1 wherein said scale comprises an elongated scale plate, and at least one guide rail extending along the length of said scale plate, said at least one guide rail comprising said second guide means, and wherein said first guide means comprises a guide shaft; and wherein said support means includes a channel for receiving said guide shaft so as to be slidable therealong, and is provided with stabilizing means for riding on said at least one guide rail.

7. The apparatus of claim 6 further comprising a tuning cable detachably secured to said support means and actuable to bidirectionally drive said support means along said guide shaft.

8. The apparatus of claim 7 wherein said support means includes grooves over which runs said tuning cable; and wherein said pointer means comprises a resilient plate, a pointer portion mechanically coupled to said resilient plate, and ears extending from said plate in a direction substantially perpendicular to the plane of said plate; and further comprising a mounting assembly on said support means for receiving said resilient plate and locating same such that said ears extend into said grooves to clamp said tuning cable therein and, thus, to said support means.

9. The apparatus of claim 8 wherein said support assembly comprises a base having an upper portion on which said grooves are provided; and ridges disposed on opposite sides of said upper portion, each ridge having a notch for guiding said tuning cable over said upper portion; and wherein said mounting assembly comprises a mounting clip disposed on said upper portion, said mounting clip having two arms spaced from said upper portion of said base to define a gap for receiving said resilient plate therein.

10. The apparatus of claim 6 wherein each of said marking means comprises a member slidable on said at least one guide rail, said member having a projection extending therefrom; and wherein said support means further includes a housing, and light switch means disposed within said housing, said light switch means receiving said projection extending from said member when said pointer means is aligned with said marking means so as to be actuated thereby for enabling said tuning circuitry to produce said output.

11. The apparatus of claim 10 wherein said light switch means comprises a light emitting source and a light sensor spaced from each other by a gap, said projection extending from said member being received in said gap when said pointer means is aligned with said marking means.

12. The apparatus of claim 10 wherein said tuning apparatus receives broadcast frequencies in at least two different broadcast bands; and wherein said elongated scale plate is provided with at least two spaced parallel guide rails extending along the length of said scale plate, each of said guide rails having plural marking means slidable thereon and engageable individually by said key means; and wherein said light switch means comprises at least two light switches, each including a light emitting source and a light sensor spaced from each other by a gap, the projection extending from a member slidable along one of said guide rails being received in the gap of an associated light switch when said pointer means is aligned with said member.

13. The apparatus of claim 12 wherein said guide shaft is parallel to said at least two guide rails; and wherein said stabilizing means provided on said support means comprises legs extending from said support means into the space between said at least two guide rails, and first and second guide elements secured to said legs and ridable on said guide rails.

14. The apparatus of claim 12 wherein the housing of said support means is rectangular and has an opening facing in the direction opposite to said scale plate, said housing including releasable locking means thereon; and a cover member for supporting said light switches, said cover member being positionable over said opening to be secured to said housing by said releasable locking means, whereby said light switches are inserted into said housing.

15. The apparatus of claim 6 wherein said guide shaft is rotatable within said support means; and wherein said key means is secured to said guide shaft so as to be rotatable therewith and slidable thereon.

16. The apparatus of claim 15 further comprising a socket secured to said elongated scale plate at one end of said plate for receiving said guide shaft for rotation therein; and a drive coupling secured to said elongated scale plate in the vicinity of the other end of said plate for receiving said guide shaft and operative to cause said guide shaft to rotate.

17. The apparatus of claim 16 further comprising manually operable means for causing said guide shaft to rotate; a rotatable support rotatably mounted in said drive coupling and coupled to said guide shaft for rotatably driving said guide shaft; and flexible strap means connected between said manually operable means and said rotatable support for rotating said rotatable support in response to the operation of said manually operable means, thereby rotatably driving said guide shaft.

18. The apparatus of claim 17 further comprising an elongated code plate mounted adjacent said scale plate; a plurality of parallel longitudinal strips provided on said code plate, each strip including a pattern of conductive and non-conductive elements for representing a respective bit in a plural-bit digital signal; a wiper element coupled to said support means for contacting said parallel strips and for scanning said strips as said support means slides along said guide shaft so as to produce a parallel plural-bit digital signal corresponding to the array of conductive and non-conductive elements with which said wiper element is in contact; and means for supplying said plural-bit digital signal to said tuning circuitry for determining the frequency of said oscillating signal, whereby said tuning apparatus is tuned to the broadcast frequency indicated by said pointer means and represented by the array of conductive and non-conductive elements contacted by said wiper element.

19. The apparatus of claim 17 wherein said elongated scale plate is provided with a pair of parallel, spaced apart guide rails, both guide rails extending along the length of said scale plate; and wherein said socket includes mounting means for mounting said socket to said pair of guide rails in the vicinity of one end of said rails; and wherein said drive coupling includes mounting means for mounting said drive coupling to said pair of guide rails in the vicinity of the other end of said rails.

* * * * *